United States Patent
Yamaguchi et al.

(10) Patent No.: US 10,451,266 B2
(45) Date of Patent: Oct. 22, 2019

(54) INTERIOR BUILDING MATERIAL AND ATTACHING STRUCTURE THEREFOR

(71) Applicant: KANEKA CORPORATION, Osaka-shi, Osaka (JP)

(72) Inventors: Youichi Yamaguchi, Tokyo (JP); Yuzuru Okuyama, Tokyo (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 16/063,823

(22) PCT Filed: Apr. 20, 2017

(86) PCT No.: PCT/JP2017/015937
§ 371 (c)(1),
(2) Date: Jun. 19, 2018

(87) PCT Pub. No.: WO2018/012077
PCT Pub. Date: Jan. 18, 2018

(65) Prior Publication Data
US 2019/0293277 A1    Sep. 26, 2019

(30) Foreign Application Priority Data
Jul. 14, 2016 (JP) .................................. 2016-139693

(51) Int. Cl.
*F21V 3/00* (2015.01)
*F21V 33/00* (2006.01)
(Continued)

(52) U.S. Cl.
CPC ............ *F21V 33/006* (2013.01); *F21S 2/005* (2013.01); *F21V 19/00* (2013.01);
(Continued)

(58) Field of Classification Search
CPC combination set(s) only.
See application file for complete search history.

(56) References Cited

U.S. PATENT DOCUMENTS

2010/0212198 A1* 8/2010 Matsunaga ........... F21V 33/006
                                                         40/564
2012/0176776 A1    7/2012 Van Herpen et al.
(Continued)

FOREIGN PATENT DOCUMENTS

JP    2004191401 A    7/2004
JP    2006321336 A    11/2006
(Continued)

OTHER PUBLICATIONS

ISA Japan Patent Office, Written Opinion Issued in PCT Application No. PCT/JP2017/015937, dated Jul. 4, 2017, WIPO, 7 pages.
(Continued)

*Primary Examiner* — Ali Alavi
(74) *Attorney, Agent, or Firm* — Alleman Hall Creasman & Tuttle LLP

(57) ABSTRACT

Provided is an interior building material having a high decorative presentation effect and an easy replacing capability of an organic EL panel. An organic EL panel is interposed between a mounting member and a decorative member. The mounting member is fixed to a wall surface of a fixed structure. The organic EL panel is directly or indirectly attachable to and detachable from the mounting member with power supply capability from a side of the mounting member. The decorative member covers an emission surface of the organic EL panel with presentation of a first pattern during non-lighting and with expression of a second pattern different from the first pattern during lighting.

10 Claims, 23 Drawing Sheets

(51) Int. Cl.
*F21V 19/00* (2006.01)
*F21S 2/00* (2016.01)
*H01L 51/50* (2006.01)
*E04F 13/08* (2006.01)
*F21V 23/06* (2006.01)

(52) U.S. Cl.
CPC .......... *H01L 51/5012* (2013.01); *E04F 13/08* (2013.01); *F21V 23/06* (2013.01)

(56) References Cited

U.S. PATENT DOCUMENTS

2016/0369515 A1    12/2016  Van Herpen et al.
2018/0259141 A1*    9/2018  Yamaguchi ......... H01L 51/5268

FOREIGN PATENT DOCUMENTS

| | | |
|---|---|---|
| JP | 3153311 U | 9/2009 |
| JP | 2012179801 A | 9/2012 |
| JP | 2013506245 A | 2/2013 |
| JP | 2013113053 A | 6/2013 |
| JP | 2014086336 A | 5/2014 |
| JP | 2014165077 A | 9/2014 |
| JP | 2016074120 A | 5/2016 |
| WO | 2011036606 A1 | 3/2011 |

OTHER PUBLICATIONS

ISA Japan Patent Office, International Search Report Issued in Application No. PCT/JP2017/015937, dated Jul. 4, 2017, WIPO, 4 pages.

\* cited by examiner

INTERIOR BUILDING MATERIAL AND ATTACHING STRUCTURE THEREFOR

TECHNICAL FIELD

The present invention relates to an interior building material having a planar light-emitting panel, and to a mounting structure of the interior building material.

BACKGROUND ART

In recent years, interior building materials that constitute interior decoration of buildings are required to have added value such as decorative presentation, in addition to a function of mere building materials. Accordingly, in Patent Document 1, a light source and a translucent decorative material are combined to add a decorative presentation.

Specifically, Patent Document 1 proposes a luminescent decorative structure using a translucent decorative material formed of a laminate including: a veneer layer made of a wooden thin veneer having translucency by WPC treatment after impregnation with resin; a masking layer disposed on a back face side of the veneer layer; and a color pattern layer disposed on a back face side of the masking layer and formed with a predetermined color pattern, in which a light source is provided on a back face side of the translucent decorative material. According to Patent Document 1, a large difference is caused in an appearance between a state in which light is applied to the translucent decorative material from the backside by a light source, and a state in which no light is applied, thus improving a decorative presentation through a change of the pattern.

PRIOR ART DOCUMENTS

Patent Documents

Patent Document 1: JP 2012-179801 A

DISCLOSURE OF INVENTION

Technical Problem

Meanwhile, an interior building material used as a part of interior decoration of a building is often continuously used as long as the building is used. However, a light-emitting panel used as a light source has a service life similarly to a conventional light-emitting panel. That is, the light-emitting panel to be incorporated in the interior building material requires periodic maintenance or the like, and a used light-emitting panel needs to be replaced with a new light-emitting panel when the light-emitting panel deteriorates.

However, in a case of using the luminescent decorative structure described in Patent Document 1, the translucent decorative material stacked with the light source is fitted into a fixed structure, which causes a problem that the light source once incorporated in the building cannot be detached from the translucent decorative material, and maintenance cannot be performed.

It is therefore an object of the present invention to provide an interior building material and a mounting structure thereof that have a high decorative presentation effect and enable easy replacement of a planar light-emitting panel.

Solution to Problem

In an aspect of the present invention for solving the above problem, an interior building material includes: a mounting member fixed to a wall surface of a fixed structure; a decorative member; and a planar light-emitting panel interposed between the mounting member and the decorative member, wherein the planar light-emitting panel is directly or indirectly attachable to and detachable from the mounting member with capability of supplying power from the mounting member side, wherein the decorative member covers an emission surface of the planar light-emitting panel, the decorative member presenting a first pattern during non-lighting, and wherein during lighting, the decorative member transmits a part of emitted light from the emission surface through the decorative member to express a second pattern different from the first pattern.

The term "indirectly attachable and detachable" as used herein means to be attachable and detachable via another component member.

According to this aspect, the planar light-emitting panel is directly or indirectly attachable to and detachable from the mounting member mounted to the wall surface. Therefore, for example, detaching the planar light-emitting panel from the mounting member enables detachment of the planar light-emitting panel from the fixed structure, allowing maintenance of the planar light-emitting panel or the like in a state of being detached. Further, even when the planar light-emitting panel deteriorates, the used planar light-emitting panel can be replaced with a new planar light-emitting panel by attaching and detaching the planar light-emitting panel to and from the mounting member.

According to this aspect, since the decorative member constituting interior decoration presents a first pattern during non-lighting and a second pattern during lighting, an appearance pattern during non-lighting can be changed to a different appearance pattern by lighting, having a high decorative presentation effect and high design property.

In a preferred aspect, the planar light-emitting panel is an organic EL panel, the decorative member includes a first surface facing to the emission surface, and a distance between the first surface and the emission surface is 0 mm or more to 10 mm or less.

According to this aspect, since an organic EL panel that emits diffused light is used as a planar light-emitting panel, which is a light source, it is possible to illuminate the decorative member with soft light.

According to this aspect, since the planar light-emitting panel is an organic EL panel, which is a planar light-emitting light source, and illuminates the decorative member, the light can be emitted in a relatively uniform plane state even with a close distance of 0 mm or more to 10 mm or less between the surface of the decorative member on the side of the planar light-emitting panel and the emission surface of the planar light-emitting panel. In addition, since the distance can be shortened between the surface of the decorative member on the side of the planar light-emitting panel and the emission surface of the planar light-emitting panel, the overall thickness can be made thinner than the thickness in a case where a point light source is used.

In a preferred aspect, a gap is formed between the mounting member and the planar light-emitting panel when the planar light-emitting panel is attached to the mounting member.

According to this aspect, it is easy to secure a movement margin of the planar light-emitting panel at a time of detachment, so that the planar light-emitting panel can be easily detached from the mounting member.

In a preferred aspect, the interior building material includes a plurality of the planar light-emitting panels attached to the decorative member, the planar light-emitting panels being electrically connected with each other.

According to this aspect, it is easy to supply power to each of the planar light-emitting panels.

In the above-described aspect, it is preferable that the planar light-emitting panels each be electrically connected in series.

According to this aspect, a constant current can be supplied to each of the planar light-emitting panels, suppressing uneven luminance between the planar light-emitting panels.

In the above-described aspect, it is preferable that the planar light-emitting panels each be electrically connected in parallel.

According to this aspect, even in a state in which one planar light-emitting panel is removed from the mounting member, other planar light-emitting panels can be used.

In a preferred aspect, the decorative member is a plate material including a first pattern forming layer that forms the first pattern and a second pattern forming layer that forms the second pattern, the first pattern forming layer faces to the second pattern forming layer in a thickness direction of the decorative member with a transparent resin in between, and the second pattern forming layer is located nearer to the planar light-emitting panel than the first pattern forming layer.

The term "transparent" as used herein means a state where an object on the other side of a material can be seen through the material, including not only colorless but also colored.

According to this aspect, since the second pattern forming layer is located on the side of the planar light-emitting panel, which is the light source, and is located on the far side as viewed from a user side (light-emitting side), light from the user side tends to be reflected by the first pattern forming layer or the transparent resin during non-lighting, and the light is unlikely to reach the second pattern forming layer. Therefore, it is possible to display substantially only the first pattern during non-lighting.

In a preferred aspect, the first pattern disappears with heat generation accompanying lighting of the planar light-emitting panel when the planar light-emitting panel is lighted up.

According to this aspect, since the first pattern of the decorative member disappears due to the heat of the planar light-emitting panel during lighting, the second pattern can be clearly displayed by lighting.

In a preferred aspect, the mounting member includes an attachment side engagement part while the planar light-emitting panel includes a panel side engagement part engageable with the attachment side engagement part.

According to this aspect, engagement and disengagement between the attachment side engagement part of the mounting member and the panel side engagement part of the planar light-emitting panel allow easy attachment and detachment of the planar light-emitting panel to and from the mounting member.

In a preferred aspect, the planar light-emitting panel is attached to the decorative member to be integrated with the decorative member.

According to this aspect, the planar light-emitting panel and the decorative member can be attached to and detached from the mounting member at the same time, and the planar light-emitting panel and the decorative member can be handled integrally, enabling improvement of workability in assembling.

In a preferred aspect, the interior building material includes a plurality of the planar light-emitting panels attached to the decorative member, the planar light-emitting panels being inseparably integrated with the decorative member.

The term "inseparably integrated" as used herein means a kind of state of being "integrated", which is a state incapable of being separated or divided unless being destroyed.

According to this aspect, a plurality of planar light-emitting panels and the decorative member can be attached to and detached from the mounting member at the same time, enabling improvement of workability in assembling.

In a preferred aspect, a Young's modulus of the decorative member is larger than a Young's modulus of the planar light-emitting panel.

According to this aspect, since the decorative member is less deflective than the planar light-emitting panel, the decorative member can reinforce flexural rigidity of the planar light-emitting panel, suppressing breakage of the planar light-emitting panel.

An aspect of the present invention includes a mounting structure mounting the interior building material described above, to the wall surface, wherein the decorative member is fixed to the wall surface with a temporary fastening element.

The term "temporary fastening element" as used herein is a kind of fastening element, and is a generic term for mechanical components that detachably couple a fastened object, including screws, clamps, pins, and the like.

According to this aspect, the decorative member is less likely to fall from the wall surface of the fixed structure.

Effect of Invention

According to the interior building material and the mounting structure thereof according to the present invention, it is possible to have a high decorative presentation effect, and to easily replace the planar light-emitting panel.

BRIEF DESCRIPTION OF DRAWINGS

FIGS. 11A and 11B are explanatory views of a decorative member of FIG. 2, wherein FIG. 11A is a perspective view as viewed from a front face side, and FIG. 11B is a perspective view as viewed from a rear face side.

FIGS. 17A and 17B are cross-sectional views of a principal part of FIG. 15, wherein FIG. 17A is a longitudinal cross-sectional view of the principal part, and FIG. 17B is a transverse cross-sectional view of the principal part.

FIGS. 18A and 18B are explanatory views of the interior building material of FIG. 1, wherein FIG. 18A is a front view showing a situation during non-lighting, and FIG. 18B is a front view showing a situation during lighting.

FIGS. 19A and 19B are explanatory views of a construction method of an interior building material according to a second embodiment of the present invention, wherein FIG. 19A is a perspective view when an organic EL panel is attached to a mounting member fixed to a wall surface, and FIG. 19B is a perspective view when a decorative member is mounted to the wall surface.

FIGS. 21A and 21B are explanatory views of the interior building material of FIG. 20, wherein FIG. 21A is a front view showing a situation during non-lighting, and FIG. 21B is a front view showing a situation during lighting.

FIGS. 25A and 25B are explanatory views of an organic EL module according to another embodiment of the present invention, wherein FIG. 25A shows a case where one organic EL panel is attached to one decorative member, and FIG. 25B shows a case where a plurality of organic EL panels are planarly attached to one decorative member.

BEST MODE FOR CARRYING OUT THE INVENTION

Hereinafter, embodiments of the present invention will be described in detail.

Figure 1:
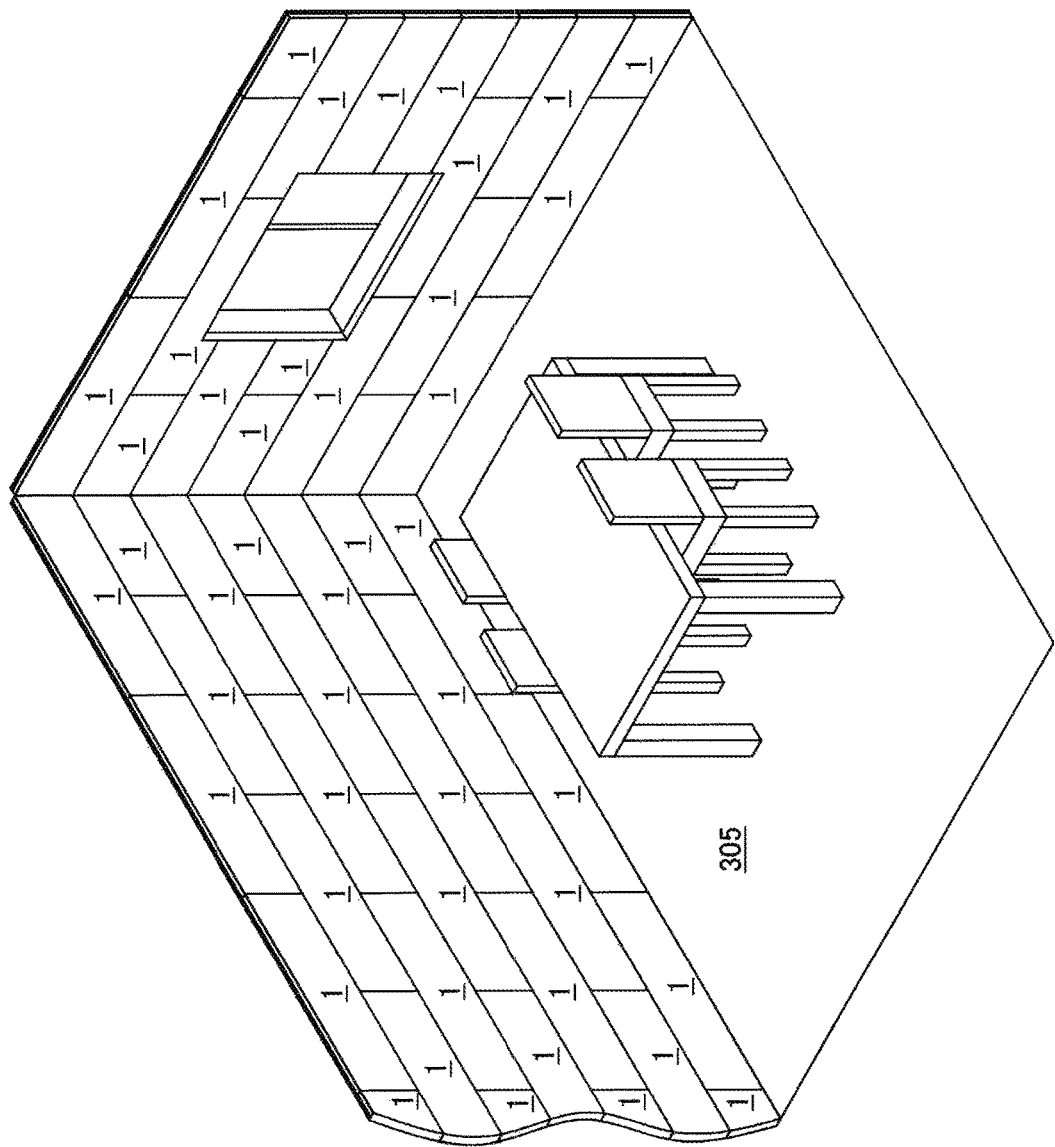
FIG. 1 is a perspective view schematically showing a usage example of an interior building material according to a first embodiment of the present invention.

An interior building material 1 according to a first embodiment of the present invention constitutes interior decoration of a building as shown in FIG. 1. The interior building material 1 is a building material that is, together with other interior building materials 1, planarly distributed and mounted to a wall surface 300 of a fixed structure such as a wall, a ceiling, or a floor, and is provided so as to be exposed to a living space 305 side.

In the following description, an attitude of the interior building material 1 is based on the attitude in FIG. 1 unless otherwise noted. That is, the interior building material 1 is based on the attitude of being mounted to the wall surface 300 in a vertical attitude as shown in FIG. 2 with an organic EL module 2 directed to the living space 305 side.

Figure 2:
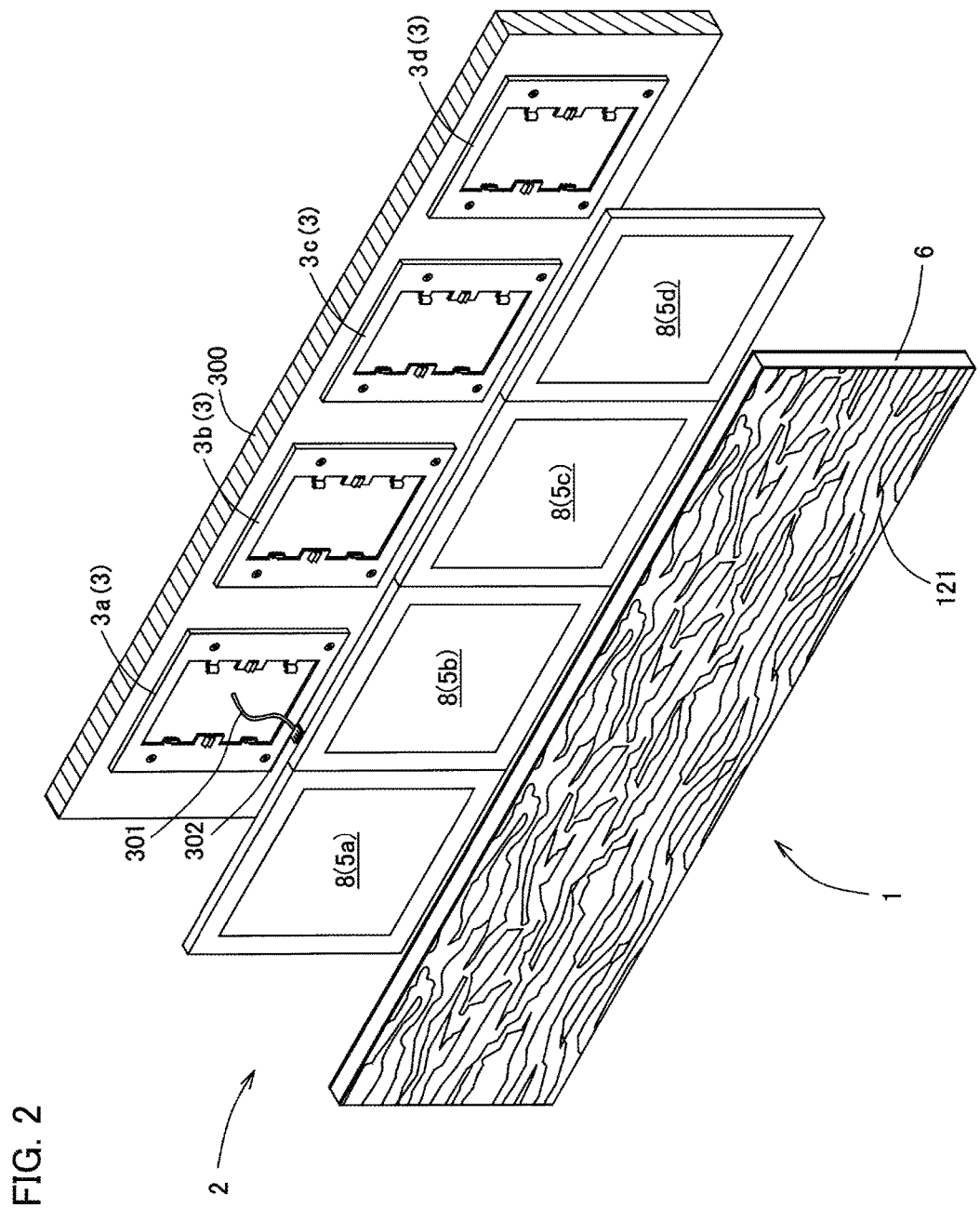
FIG. 2 is an exploded perspective view of the interior building material of FIG. 1.

As shown in FIG. 2, the interior building material 1 includes the organic EL module 2 and a mounting member 3 (3a to 3d) as main component members. The organic EL module 2 and the mounting member 3 are attachable to and detachable from each other by relatively sliding the organic EL module 2 with the mounting member 3 mounted to the wall surface 300.

Figure 3:
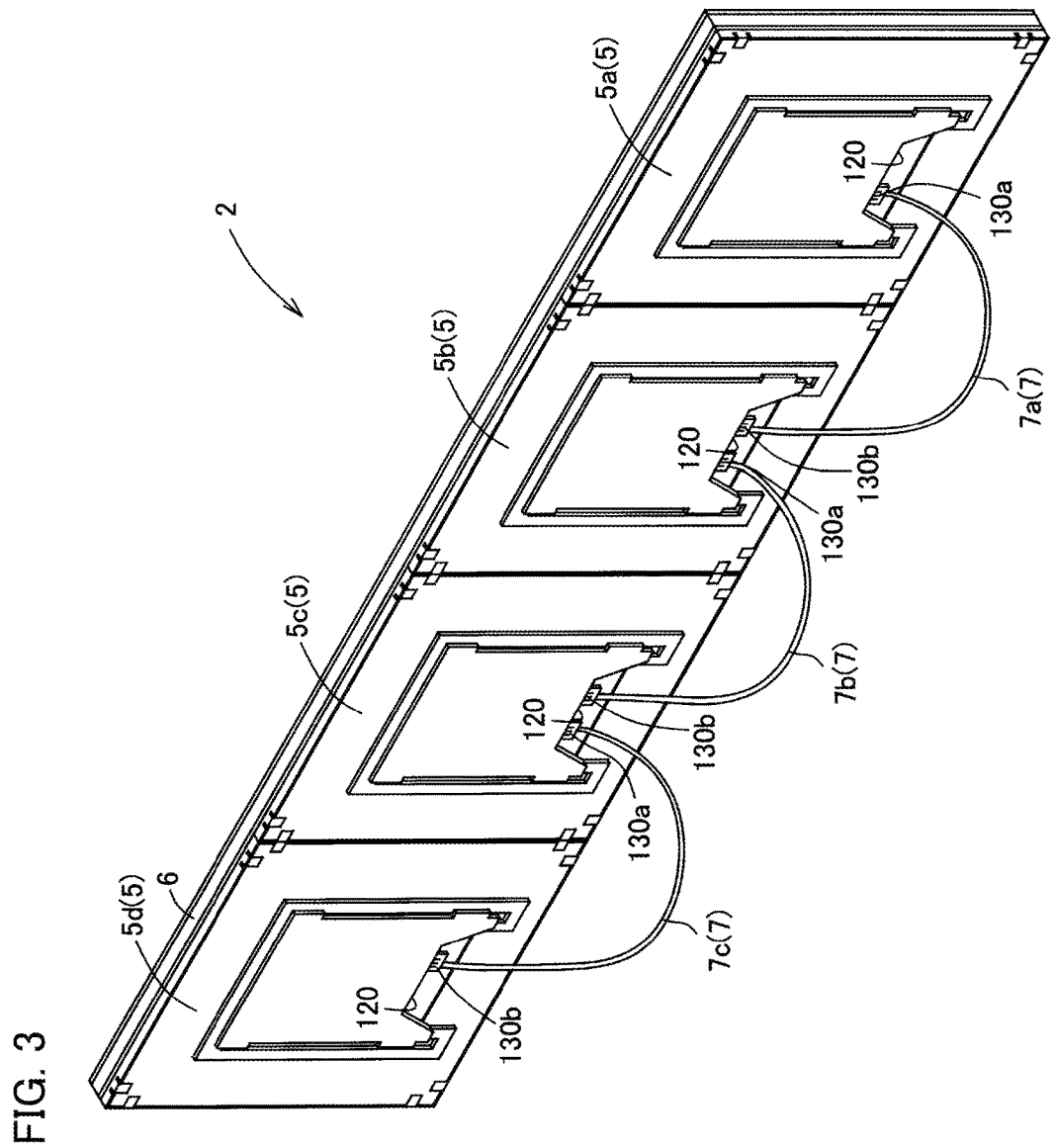
FIG. 3 is a perspective view of an organic EL module of FIG. 2, as viewed from a rear face side.

As can be seen from FIGS. 2 and 3, the organic EL module 2 includes a plurality of organic EL panels 5 (5a to 5d) (planar light-emitting panels), a decorative member 6, and a plurality of connecting cable members 7 (7a to 7c), and the organic EL panels 5a to 5d each are connected by connecting cable members 7a to 7c. Specifically, in the organic EL module 2, the organic EL panels 5a to 5d each are electrically connected in series by the connecting cable members 7a to 7c, and supplying power to one organic EL panel 5a enables power supply to each of the organic EL panels 5a to 5d.

As shown in FIG. 2, each of the organic EL panels 5 is a quadrangular plate-shaped panel in a front view, and is a planar light-emitting panel having an emission surface 8 having a quadrangular shape, being capable of emitting diffused light from the emission surface 8. As can be seen from FIGS. 4 and 5, each of the organic EL panels 5 includes a panel body 10, a circuit board 11, a first case member 12, and a second case member 15.

The panel body 10 is an organic EL device incorporating an organic EL element, and the organic EL element can emit light when energized. In this organic EL element, an organic light-emitting layer is sandwiched between two opposed electrode layers.

Figure 4:
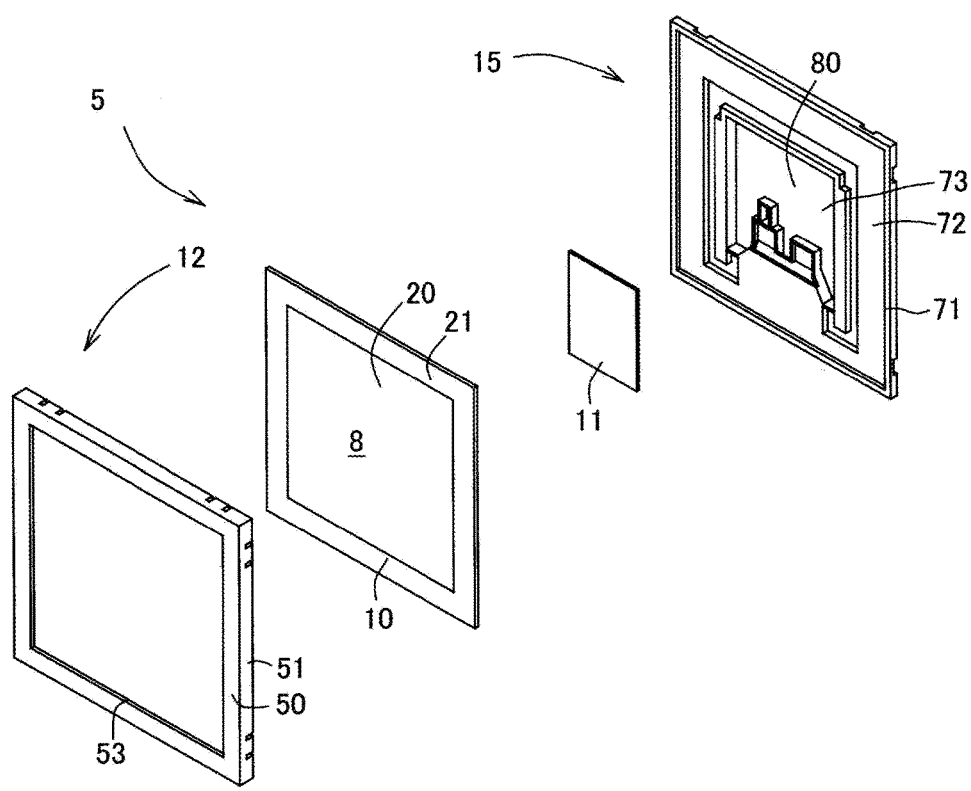
FIG. 4 is an exploded perspective view of an organic EL panel of FIG. 2.

As can be seen from FIG. 4, in the panel body 10, a light-emitting region 20 corresponding to the emission surface 8 is formed in the central portion in a front view, and a casing region 21 is formed so as to surround a periphery of the light-emitting region 20.

The light-emitting region 20 is a light-emitting region that emits light during lighting, and can emit light with a desired emission color. The light-emitting region 20 is a region corresponding to an overlapping portion of a first electrode layer, the organic light-emitting layer, and a second electrode layer of the organic EL element, and is also a diffused light-emitting region that emits diffused light during lighting. That is, the emission surface 8 is a diffused-light emitting surface belonging to the light-emitting region 20. The light-emitting region 20 has a shape similar to that of the panel body 10, and specifically has a quadrangular shape.

The casing region 21 is a region other than the light-emitting region 20, and is a non-light-emitting region that emits no light during lighting. The casing region 21 is annularly continuous around the light-emitting region 20, and specifically has a rectangular ring shape.

Figure 5:
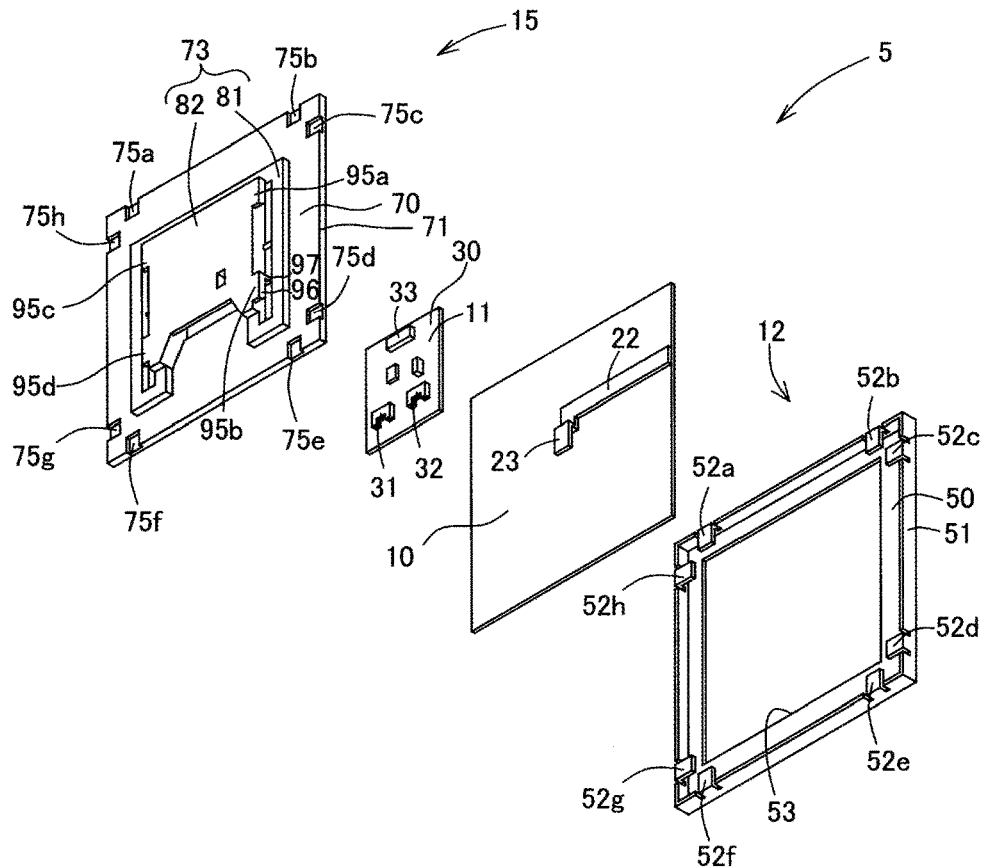
FIG. 5 is an exploded perspective view of the organic EL panel of FIG. 2, as viewed from a direction different from that of FIG. 4.

As shown in FIG. 5, the panel body 10 is provided with a panel side power supply portion 22 on a rear face of the panel body 10.

The panel side power supply portion 22 is electrically connected to the organic EL element inside the panel body 10, and is a part extending in a tongue shape from near an end of the panel body 10. The panel side power supply portion 22 is supported in a cantilever manner from near an edge of the panel body 10, and has a panel side connector portion 23 at a distal end of the panel side power supply portion 22. A proximal portion of the panel side power supply portion 22 is located on a rear face of the casing region 21 (on a projection surface in a thickness direction of the casing region 21). The panel side connector portion 23 located at the distal end of the panel side power supply portion 22 is located on a rear face of the light-emitting region 20 (on the projection surface in a thickness direction of the light-emitting region 20).

Figure 6:
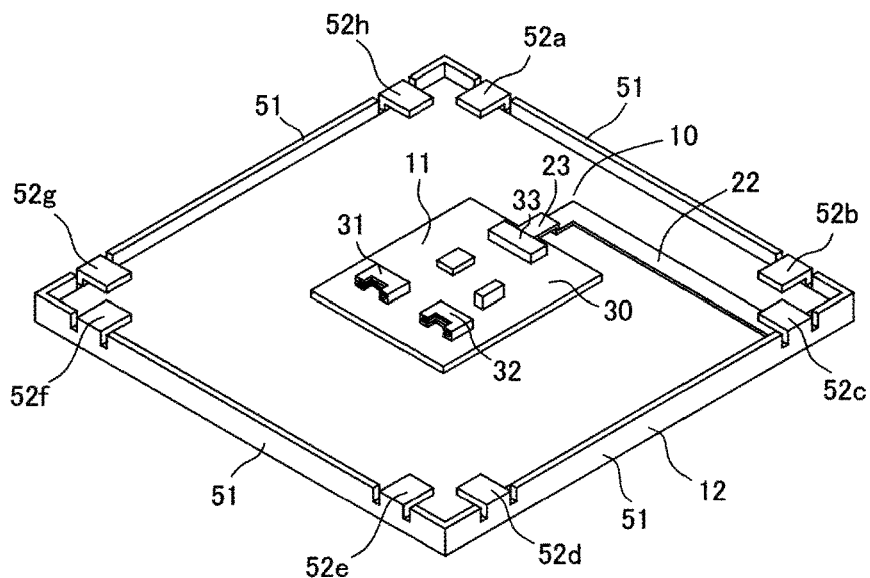
FIG. 6 is a perspective view showing a state in which a second case member is detached from the organic EL panel in FIG. 2.

As can be seen from FIG. 6, the panel side connector portion 23 is a connector that is connected to a panel connector portion 33 of the circuit board 11 to electrically connect the organic EL element of the panel body 10 to the circuit board 11, when each of the organic EL panels 5 is assembled. That is, the panel side connector portion 23 is a connector that forms a pair with the panel connector portion 33 of the circuit board 11, and specifically is a male connector. The panel side connector portion 23 can be inserted into the panel connector portion 33 of the circuit board 11.

The circuit board 11 is a control board that controls dimming and the like for the organic EL element incorporated in the panel body 10. As shown in FIG. 6, the circuit board 11 has connecting connector portions 31 and 32 and the panel connector portion 33 that are mounted on a printed circuit board, and the connecting connector portions 31 and 32 are electrically connected to the panel connector portion 33 via a printed wiring line (not shown).

The connecting connector portions 31 and 32 are connectors connectable to connector portions 130a, 130b, and 302 (see FIGS. 2 and 3) of the cable members 7 and a cable member 301, and can receive power from outside by connecting to the connector portions 130a, 130b, and 302. Specifically, both of the connecting connector portions 31 and 32 are female connectors having an identical shape to each other, and both of the connecting connector portions 31 and 32 can be connected with the connector portions 130a, 130b, and 302 of the cable members 7 and 301, as shown in FIG. 3.

As shown in FIG. 6, the panel connector portion 33 is a connector that forms a pair with the panel side connector portion 23 of the panel body 10, and is a power supply connector that supplies power to the panel body 10. Specifically, the panel connector portion 33 is a female connector, and can be inserted with the panel side connector portion 23.

The first case member 12 is a protective frame to protect near a peripheral end of the panel body 10, and is also an insulating case having electrical insulation properties. As can be seen from FIGS. 5 and 6, the first case member 12 mainly includes a light-emitting side cover 50, an end face side cover 51, and case side fixing pieces 52a to 52h.

As shown in FIG. 4, the light-emitting side cover 50 is a part covering a part of a front face of the panel body 10 (an emission surface 8 side), and specifically is a part covering the casing region 21 of the panel body 10. The light-emitting side cover 50 annularly extends along an edge of the emission surface 8 of the panel body 10, and includes a takeout opening 53 through which light emitted from the emission surface 8 passes and is externally taken.

As shown in FIG. 6, the end face side cover 51 is a part covering a part or the whole of an end face of the panel body 10, and is a wall part provided upright in a thickness direction of each of the organic EL panels 5 from an outer end of the light-emitting side cover 50 in a front view.

As can be seen from FIG. 5, the case side fixing pieces 52a to 52h are engaging pieces to engage with and fix the second case member 15, and are locking pieces to lock a movement of the second case member 15 in a separating direction. Each of the case side fixing pieces 52a to 52h is bent inward from an end of the end face side cover 51 (an end opposite to the light-emitting side cover 50), and provided corresponding to each side of the panel body 10.

Figure 7:
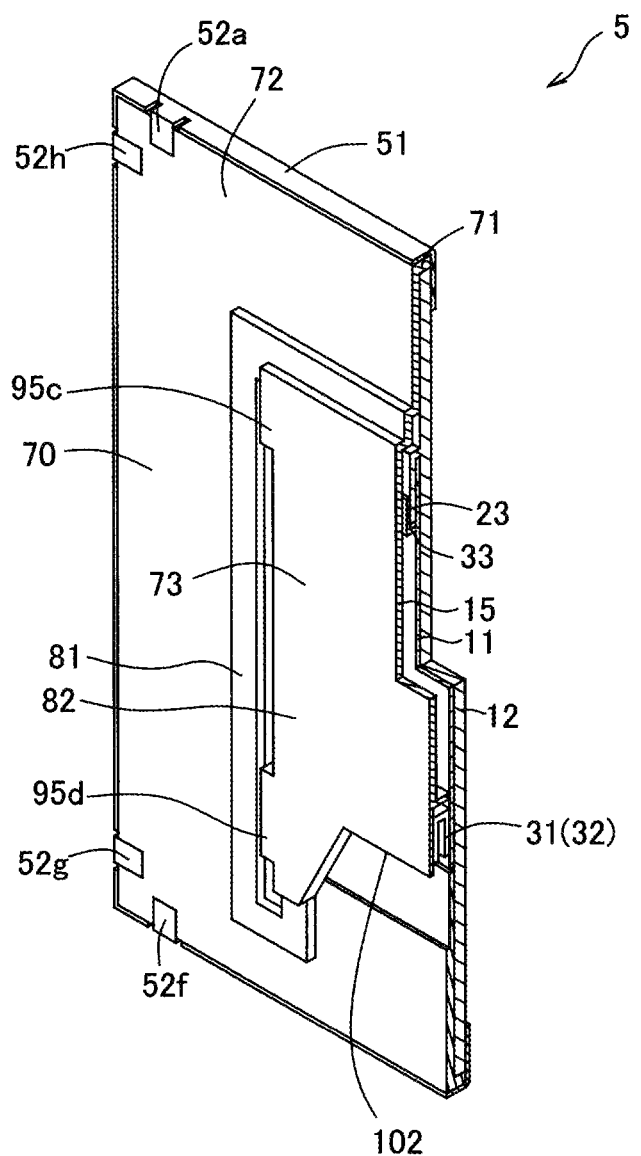
FIG. 7 is a longitudinal cross-sectional perspective view of the organic EL panel of FIG. 2.

The second case member 15 is a protective case to protect the panel body 10 and the circuit board 11 together with the first case member 12, and is also an insulating case having electrical insulation properties. The second case member 15 is also a fixing member to fix the organic EL module 2 to the mounting member 3. As shown in FIG. 7, the second case member 15 includes a rear face side cover 70 and an end face side cover 71.

The rear face side cover 70 is a plate-shaped part covering the rear face side of the panel body 10 and the circuit board 11, and has a rectangular shape in a rear view, and a substantially convex shape with a substantially central portion of the rear face side cover 70 protruding toward the rear face side, in a side view.

Figure 8:
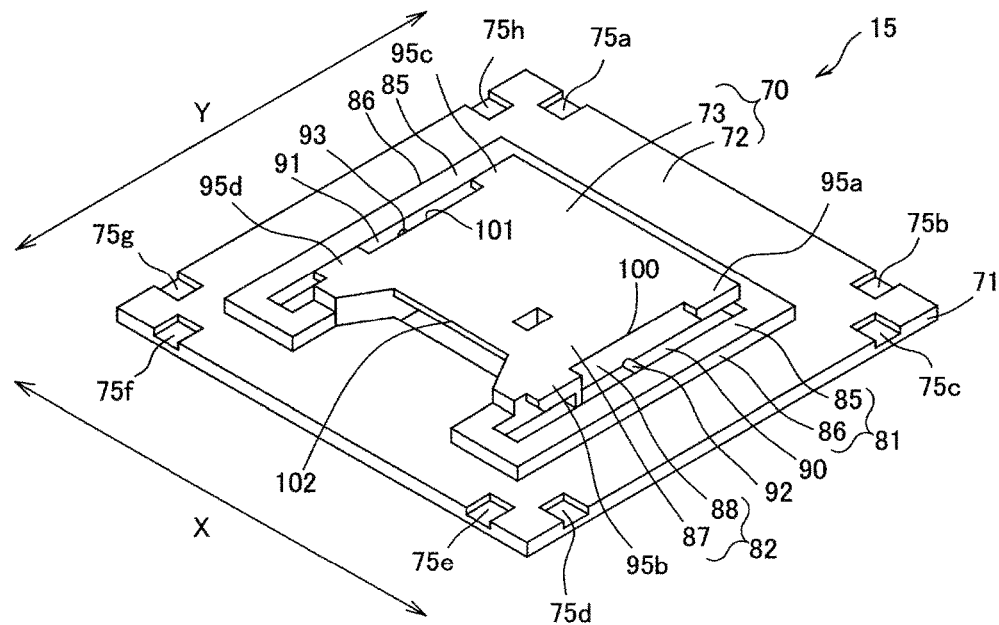
FIG. 8 is a perspective view of the second case member of FIG. 5.

As shown in FIG. 8, the rear face side cover 70 includes a main body 72 and a base part 73.

Figure 9:
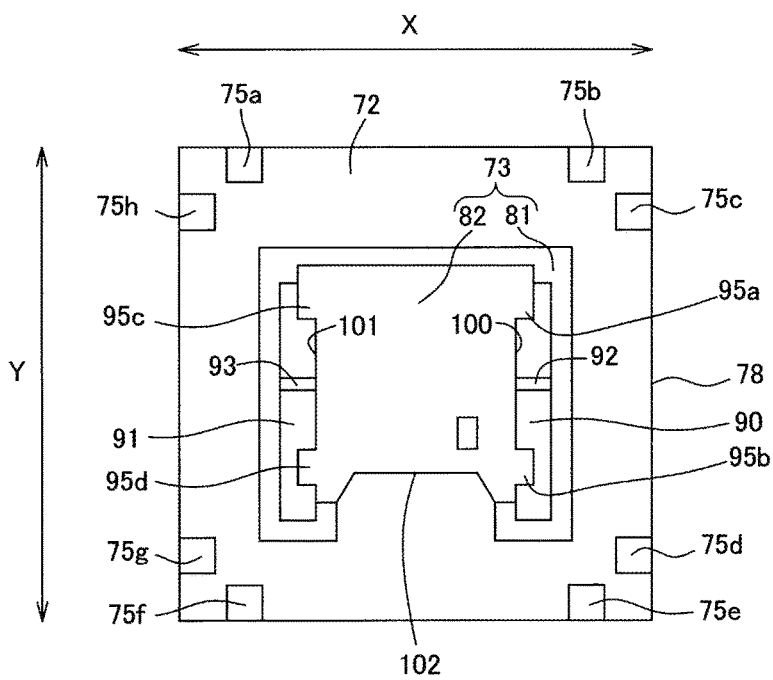
FIG. 9 is a rear view of the second case member of FIG. 8.

The main body 72 is a protective part to mainly protect a rear face of the panel body 10, and is also a support part to support the panel body 10. The main body 72 includes fixing recesses 75a to 75h on respective sides as shown in FIG. 9.

The fixing recesses 75a to 75h are engageable with the case side fixing pieces 52a to 52h of the first case member 12, and are groove-shaped recessed sections extending from respective sides toward the center side in a rear view.

The base part 73 is a part that stores and protects the circuit board 11, and is attachable to and detachable from the mounting member 3. As shown in FIG. 8, the base part 73 forms a step with respect to the main body 72, which is another part of the rear face side cover 70, and the base part 73 is a raised part convexly raised.

When each of the organic EL panels 5 is assembled, the base part 73 protrudes toward the rear face side so as to avoid the circuit board 11. That is, as shown in FIG. 4, the base part 73 is formed with a storage recess 80 capable of housing the circuit board 11 as viewed from a front face side, and protrudes from the main body 72 toward the rear face side by a recessed amount of the storage recess 80.

As shown in FIG. 8, the base part 73 includes a first raised part 81 and a second raised part 82, and is raised from the main body 72 stepwise toward the rear face side.

As shown in FIG. 8, the first raised part 81 is a part being raised with respect to the main body 72 and forming a substantially U-shape in a rear view, and includes a first rear face side wall part 85, and a first connecting wall part 86.

The first rear face side wall part 85 is a wall part located on the rear face side with respect to the main body 72, and has a plane surface substantially without unevenness.

The term "plane surface substantially without unevenness" as used herein means a surface having no unevenness to a degree not to engage with another member due to unevenness, including a surface with fine unevenness that does not engage with another member due to unevenness. The same applies hereinafter unless otherwise noted.

The first connecting wall part 86 is a wall part standing upright from the main body 72, and connecting the main body 72 and an outer peripheral edge of the first rear face side wall part 85.

The second raised part 82, having a substantially rectangular shape, is a part further raised with respect to the first raised part 81, and is a part overlapping with most or all of the circuit board 11 in a rear view to cover the circuit board 11. As shown in FIG. 8, the second raised part 82 includes a second rear face side wall part 87 and a second connecting wall part 88.

The second rear face side wall part 87 is a wall part located on the rear face side with respect to the first rear face side wall part 85, and has a plane surface substantially without unevenness.

The second connecting wall part 88 is a wall part standing upright with respect to the first rear face side wall part 85, and connecting the first rear face side wall part 85 and an outer peripheral edge of the second rear face side wall part 87.

As shown in FIG. 9, the base part 73 includes slide grooves 90 and 91 at a boundary portion between the first raised part 81 and the second raised part 82 in a lateral direction X.

The slide grooves 90 and 91 are bottomed grooves having a depth in a thickness direction and linearly extending in a vertical direction Y (up-down direction), and are guide grooves to regulate a movement of an attachment side engagement part 151 of the mounting member 3. The first raised part 81 and the second raised part 82 are partially cut out respectively, so that the slide grooves 90 and 91 are formed across the first raised part 81 and the second raised part 82.

On bottom parts of the slide grooves 90 and 91, case side locking pieces 92 and 93 are provided in a middle section in the vertical direction Y.

The case side locking pieces 92 and 93 are regulating parts that regulate a movement of the organic EL module 2 in the vertical direction Y (perpendicular direction) with respect to the mounting member 3, by engaging with attachment side locking pieces 152 and 153 of the mounting member 3. The case side locking pieces 92 and 93 are protrusions protruding from the bottom parts of the slide grooves 90 and 91 toward the rear face side, and extend in a direction orthogonal to an extending direction of the slide grooves 90 and 91.

As shown in FIG. 8, the base part 73 includes panel side engagement parts 95a to 95d standing upright with respect to the second connecting wall part 88.

Figure 10:
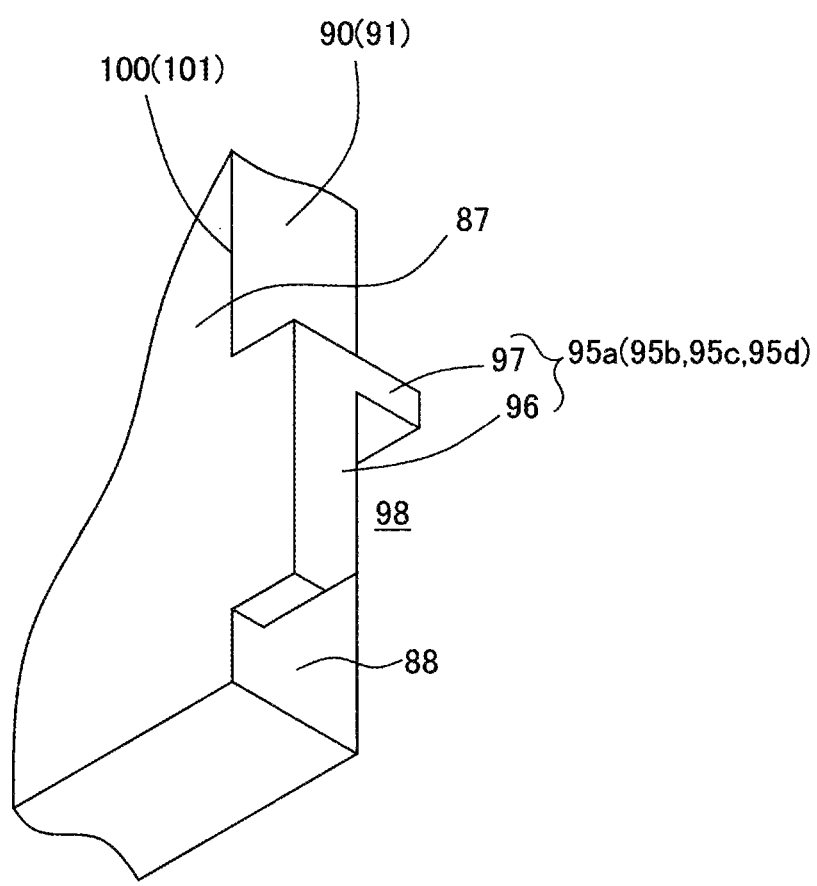
FIG. 10 is an enlarged view of a principal part of the second case member in FIG. 8.

The panel side engagement parts 95a to 95d are engaging pieces protruding in a direction orthogonal to a raised direction of the base part 73, and are substantially L-shaped in a side view as shown in FIG. 10. The panel side engagement parts 95a to 95d have a first engagement part 96 and a second engagement part 97 crossing each other, and an insertion space 98 is formed between the first engagement part 96 and the main body 72. The panel side engagement parts 95a to 95d are overhanging pieces projecting upright with respect to the second connecting wall part 88 toward the slide grooves 90 and 91, and are located on the projection surface in a thickness direction of the slide grooves 90 and 91.

As shown in FIG. 10, the first engagement part 96 is a part extending in the vertical direction Y along a vertical side 100 or a vertical side 101 of the second rear face side wall part 87 in a side view, and projecting outward with respect to the second connecting wall part 88 continuously to the second rear face side wall part 87 in a rear view. That is, the first engagement part 96 can also be considered as an extension part of the second rear face side wall part 87, protruding like eaves from the second rear face side wall part 87.

The second engagement part 97 is a part extending in a member thickness direction from one end (upper end) of the first engagement part 96 in the vertical direction Y in a side view, and projecting outwardly with respect to the second connecting wall part 88 in a rear view.

As shown in FIG. 8, the panel side engagement parts 95a and 95b are provided along the vertical side 100 of the second rear face side wall part 87 in a rear view, and are arranged spaced apart from each other in the vertical direction Y. Specifically, the panel side engagement part 95a is provided near the upper end of the vertical side 100, while the panel side engagement part 95b is provided near the lower end of the vertical side 100.

The panel side engagement parts 95c and 95d are provided on the vertical side 101 of the second rear face side wall part 87, and are arranged spaced apart from each other in the vertical direction Y. Specifically, the panel side engagement part 95c is provided near the upper end of the vertical side 101, while the panel side engagement part 95d is provided near the lower end of the vertical side 101.

The panel side engagement parts 95a and 95b are arranged at positions corresponding to the panel side engagement parts 95c and 95d in the lateral direction X. As shown in FIG. 9, the panel side engagement parts 95a and 95b extend toward the right side in a rear view, while the panel side engagement parts 95c and 95d extend toward the left side in a rear view. That is, the panel side engagement parts 95a and 95b and the panel side engagement parts 95c and 95d project in directions separating from each other.

As shown in FIG. 8, the base part 73 includes a connector cutout part 102 extending in the vertical direction Y from the lower end of the first raised part 81.

As shown in FIG. 7, the connector cutout part 102 is a cutout to connect the connector portions 130a, 130b, and 302 (see FIGS. 2 and 3) of the cable member 301 to the connecting connector portions 31 and 32 of the circuit board 11, and is a cutout straddling the first raised part 81 and the second raised part 82. That is, the connector cutout part 102 is formed with an opening through which the connector portions 130a, 130b, and 302 of the cable members 7 and 301 can pass.

The end face side cover 71 is a wall part rising along each side of the rear face side cover 70, and is a part covering the end face of the panel body 10.

A positional relationship of individual parts of each of the organic EL panels 5 will be described.

In each of the organic EL panels 5, as can be seen from FIG. 7, the circuit board 11 is arranged on the rear face side of the panel body 10, while the panel side connector portion 23 is inserted into and connected to the panel connector portion 33.

The panel body 10 and the circuit board 11 are sandwiched between the first case member 12 and the second case member 15, and the case side fixing piece 52 of the first case member 12 is engaged with the fixing recesses 75a to 75h of the second case member 15. That is, a rear face of the circuit board 11 is covered with the second case member 15, while the connector portions 31 to 33 and the like of the circuit board 11 are stored in the storage recess 80.

The connecting connector portions 31 and 32 of the circuit board 11 are located near the connector cutout part 102, and an insertion opening of the connecting connector portions 31 and 32 is exposed from the connector cutout part 102 of the second case member 15. Therefore, the connecting connector portions 31 and 32 can be inserted with the connector portions 130a, 130b, and 302 of the cable members 7 and 301 respectively, from the rear face side of the second case member 15.

The decorative member 6 is a member provided on a light-emitting surface of each of the organic EL panels 5 to decorate the surface, and is an interior plate with planar extension. The decorative member 6 of the present embodiment is a horizontally long rectangular plate material, and has a width of about four times a width (length in the lateral direction) of each of the organic EL panels 5.

Further, the decorative member 6 has a thickness larger than that of each of the organic EL panels 5, and a Young's modulus larger than that of each of the organic EL panels 5. That is, the decorative member 6 has a large bending strength, and is less deflective than each of the organic EL panels 5.

Figure 11A:
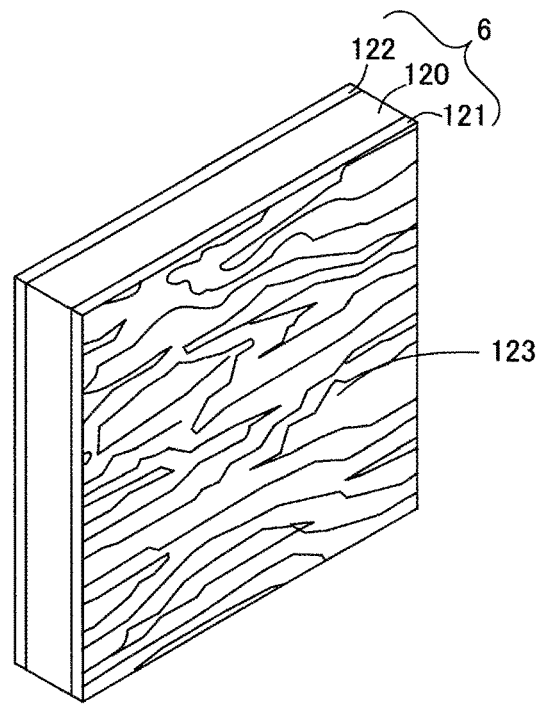
Figure 11B:
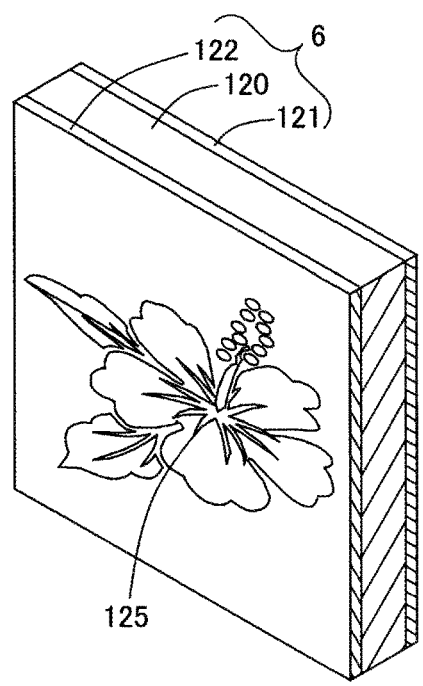

The decorative member 6 is formed of a transparent material as a main material, and includes a first pattern forming layer 121 formed on one main surface of a transparent substrate 120, and a second pattern forming layer 122 formed on another main surface of the transparent substrate 120, as shown in FIGS. 11A and 11B.

The term "main material" as used herein means a material occupying 50% or more of all materials.

The transparent substrate 120 is a transparent substrate having transparency, and is a transparent resin substrate in the present embodiment.

The first pattern forming layer 121 is a semi-translucent colored pattern layer to form a colored pattern, and is a layer constituting an interior surface of the decorative member 6.

The term "semi-translucent" as used herein means a state of transmitting a part of light, which is the middle between a translucency that completely permits transmission of light and non-translucency that completely inhibits transmission of light.

The first pattern forming layer 121 preferably has a light transmittance of 10% or more to 90% or less, and more preferably 30% or more to 60% or less.

The first pattern forming layer 121 of the present embodiment is formed of a wood plastic composite material, which is a composite material obtained by kneading wood powder and a thermoplastic resin, and performing extruded molding or injection molding. The first pattern forming layer 121 is formed with a first pattern 123 of a woodgrain pattern.

The first pattern 123 is formed on a part or the entire surface of one main surface of the transparent substrate 120.

The second pattern forming layer 122 is a colored pattern layer to form a colored pattern, and is capable of transmitting a part of the emitted light from each of the organic EL panels 5. The second pattern forming layer 122 of the present embodiment is formed of colored pattern Japanese paper, which is a porous body on which a pattern is drawn, and a second pattern 125 of a floral pattern is formed on a part of the second pattern forming layer 122.

The second pattern 125 is a pattern different from the first pattern 123, and is a pattern not included in the first pattern 123 in the present embodiment. The second pattern 125 is formed on a part or the entire surface of another main surface of the transparent substrate 120.

The second pattern forming layer 122 is opposed to the first pattern forming layer 121 in the thickness direction of the decorative member 6 with the transparent substrate 120 sandwiched in between.

As shown in FIG. 3, each of the connecting cable members 7 (7a to 7c) is a cable to connect between adjacent organic EL panels 5 and 5, and is linear with the connector portions 130a and 130b provided at both ends in the longitudinal direction. Both of the connector portions 130a and 130b can be connected to the connecting connector portions 31 and 32 of each of the organic EL panels 5.

Figure 12:
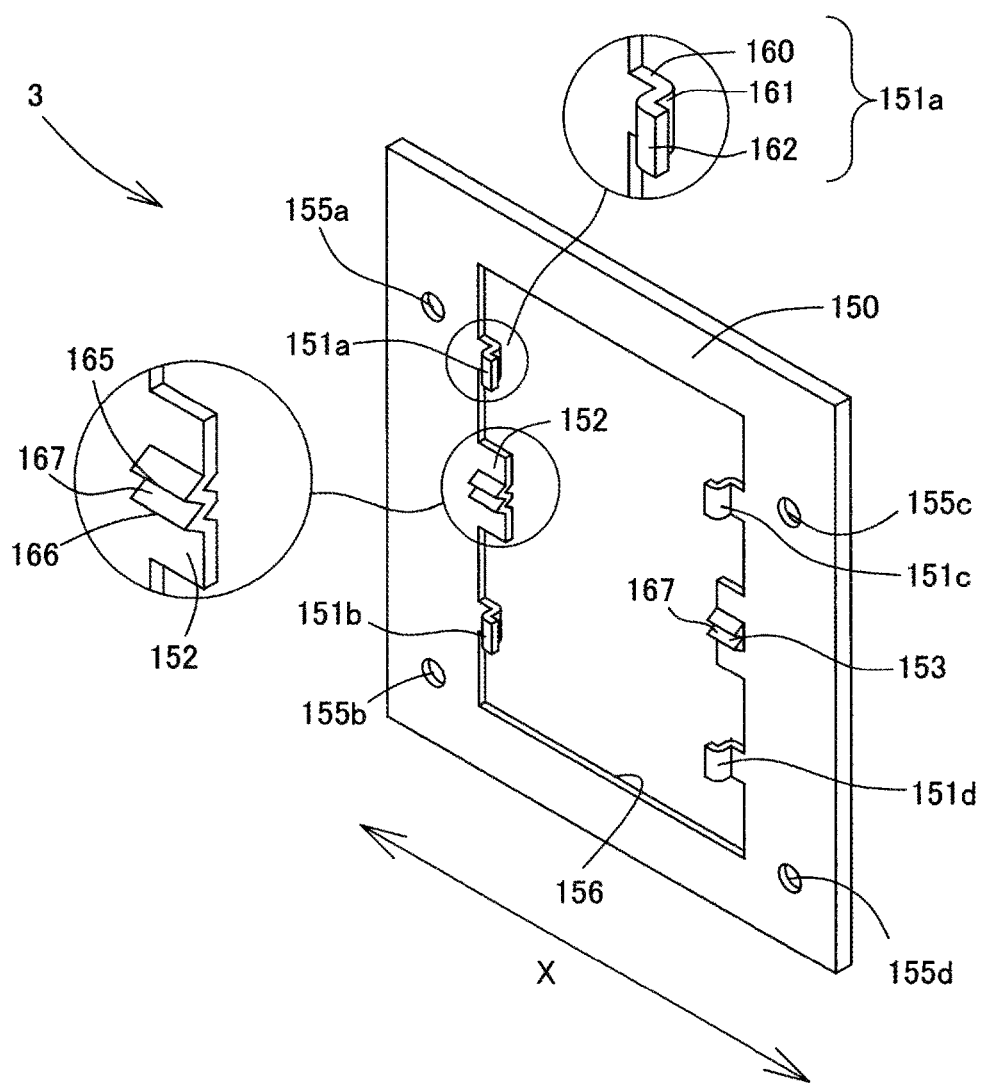
FIG. 12 is a perspective view of a mounting member of FIG. 2.

The mounting member 3 (3a to 3d) is a member to attach the organic EL module 2 to the wall surface 300 of the fixed structure as shown in FIG. 12, and includes a main body 150, attachment side engagement parts 151a to 151d, the attachment side locking pieces 152 and 153, and mounting holes 155a to 155d.

The main body 150 is a plate-shaped part having a through hole 156 whose opening shape is substantially quadrangular.

The through hole 156 is a through hole penetrating in the member thickness direction, and is an insertion hole that can be inserted with the base part 73 of each of the organic EL panels 5.

The attachment side engagement parts 151a to 151d are engaging pieces engageable with the panel side engagement parts 95a to 95d of the second case member 15 of each of the organic EL panels 5, and are protruding pieces protruding toward the front face side with respect to the main body 150. The attachment side engagement parts 151a to 151d are supported in a cantilever manner from an opening edge of the through hole 156 of the main body 150, and also are overhanging pieces projecting from the main body 150 toward the center side of the through hole 156.

As shown in the enlarged view of FIG. 12, the attachment side engagement part 151 includes a connecting wall part 160, a vertical wall part 161, and a locking wall part 162. The connecting wall part 160 and the locking wall part 162 are connected with a step, by the vertical wall part 161.

The attachment side locking pieces 152 and 153 are regulating parts that are engaged with the case side locking pieces 92 and 93 of the second case member 15 of each of the organic EL panels 5, to restrict a movement of the organic EL module 2 in the vertical direction Y with respect to the mounting member 3. The attachment side locking pieces 152 and 153 are supported in a cantilever manner from the opening edge of the through hole 156 of the main body 150, and also are overhanging pieces projecting from the main body 150 toward the center side of the through hole 156.

The attachment side locking pieces 152 and 153 are bent in a wave shape in the vertical direction Y, and formed with attachment side protrusions 165 and 166 extending in the lateral direction X.

The attachment side protrusions 165 and 166 are arranged aligned at a predetermined interval in a height direction (vertical direction Y), and the side walls of the attachment side protrusions 165 and 166 form an attachment side recess 167.

The attachment side recess 167 is an engagement recess engageable with the case side locking pieces 92 and 93.

The mounting holes 155a to 155d are insertion holes that can be inserted with a fastening element 303 such as a screw.

A positional relationship of individual parts of the mounting member 3 will be described.

As shown in FIG. 12, the mounting member 3 has the through hole 156 formed in the center of the mounting member 3 in the lateral direction X, and each of the mounting holes 155a and 155b and the mounting holes 155c and 155d is disposed outside the through hole 156. Each of the attachment side engagement parts 151a to 151d and the attachment side locking pieces 152 and 153 extends from an edge of the through hole 156 toward the center side of the through hole 156. Specifically, the attachment side engagement parts 151a and 151b and the attachment side engagement parts 151c and 151d extend in the lateral direction X and in a direction approaching each other (inward direction). Similarly, the attachment side locking piece 152 and the attachment side locking piece 153 extend in the lateral direction X and in a direction approaching each other (inward direction).

In the mounting member 3, in the vertical direction Y, the attachment side locking pieces 152 and 153 are provided at the center, while the attachment side engagement parts 151a and 151c and the attachment side engagement parts 151b and 151d are provided outside the attachment side locking pieces 152 and 153. The mounting member 3 is vertically symmetric with respect to the attachment side locking pieces 152 and 153. That is, a distance from the attachment side engagement parts 151a and 151c to the attachment side locking pieces 152 and 153 is equal to a distance from the attachment side engagement parts 151b and 151d to the attachment side locking pieces 152 and 153.

Next, a positional relationship of individual members of the interior building material 1 according to the first embodiment of the present invention will be described.

In the interior building material 1, a plurality of the organic EL panels 5a to 5d are interposed between the mounting member 3 and the decorative member 6. Specifically, in the interior building material 1, as can be seen from FIGS. 2 and 3, the emission surfaces 8, 8, 8, and 8 of the respective organic EL panels 5a to 5d are directed in an identical direction, and the decorative member 6 covers across the emission surfaces 8, 8, 8, and 8 of the respective organic EL panels 5a to 5d. Then, the decorative member 6 and each of the organic EL panels 5a to 5d are bonded by a transparent adhesive (not shown). That is, the decorative member 6 faces to the emission surface 8 of each of the organic EL panels 5a to 5d, and is provided across each boundary portion of the emission surface 8 of each of the organic EL panels 5a to 5d, to be inseparably integrated with each of the organic EL panels 5a to 5d.

The term "adhesive" as used herein means one capable of bonding at least two members, including not only a cured liquid or gel adhesive but also an adhesive sheet or an adhesive tape (e.g., a double-sided tape) subjected to adhesive processing on a surface of a sheet or a tape. That is, properties at a time of adhesion are not limited. Meanwhile, a part of the decorative member 6 may be fused to be bonded to each of the organic EL panels 5.

Further, the transparent adhesive may be provided only on the light-emitting side cover 50 of the first case member 12, or may be provided over the emission surface 8 of the panel body 10 as well.

In the decorative member 6, the second pattern forming layer 122 is located closer to each of the organic EL panels 5 than the first pattern forming layer 121, and the first pattern 123 of the first pattern forming layer 121 is reflected in the appearance during non-lighting.

The surface of the decorative member 6 on a side of each of the organic EL panels 5 is substantially parallel to the emission surface 8 of each of the organic EL panels 5, and the distance between them is preferably 0 mm or more to 10 mm or less.

Further, the distance between the first pattern forming layer 121 and the emission surface 8 of each of the organic EL panels 5 is preferably 50 mm or less.

Next, a construction method of the interior building material 1 according to the first embodiment of the present invention will be described.

For the sake of explanation, explanation will be made while assuming that the connector portion 302 of the cable member 301 is exposed from the wall surface 300 in advance.

Figure 13:
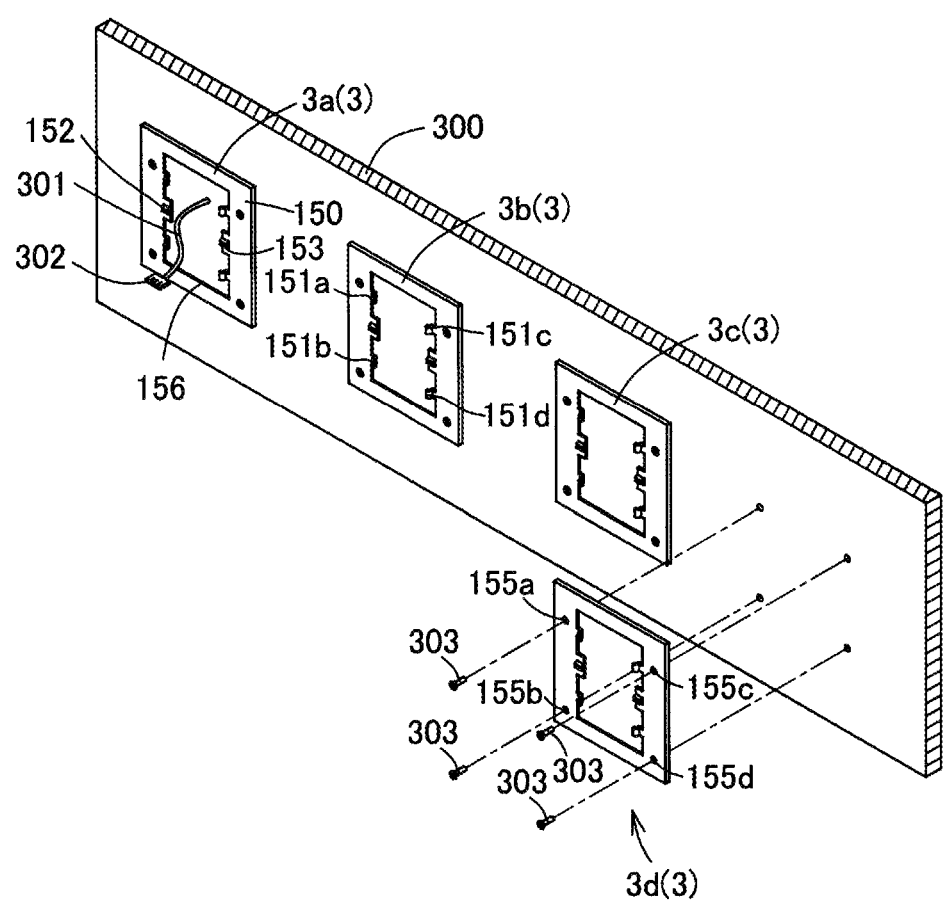
FIG. 13 is an explanatory view of a construction method of the interior building material according to the present invention, and is a perspective view showing a situation when the mounting member is mounted to a wall surface.

First, as shown in FIG. 13, the fastening element 303 is inserted through the mounting holes 155a to 155d of the mounting members 3a to 3d, and each of the mounting members 3a to 3d is mounted to the wall surface 300.

At this time, the connector portion 302 of the cable member 301 passes through the through hole 156 of the mounting member 3a from the rear face side of the mounting member 3a, and projects to the front face side. In the mounting members 3a to 3d, the main body 150 is in surface contact with the wall surface 300, and the engagement parts 151a to 151d and the locking pieces 152 and 153 project forward from the main body 150.

Figure 14:
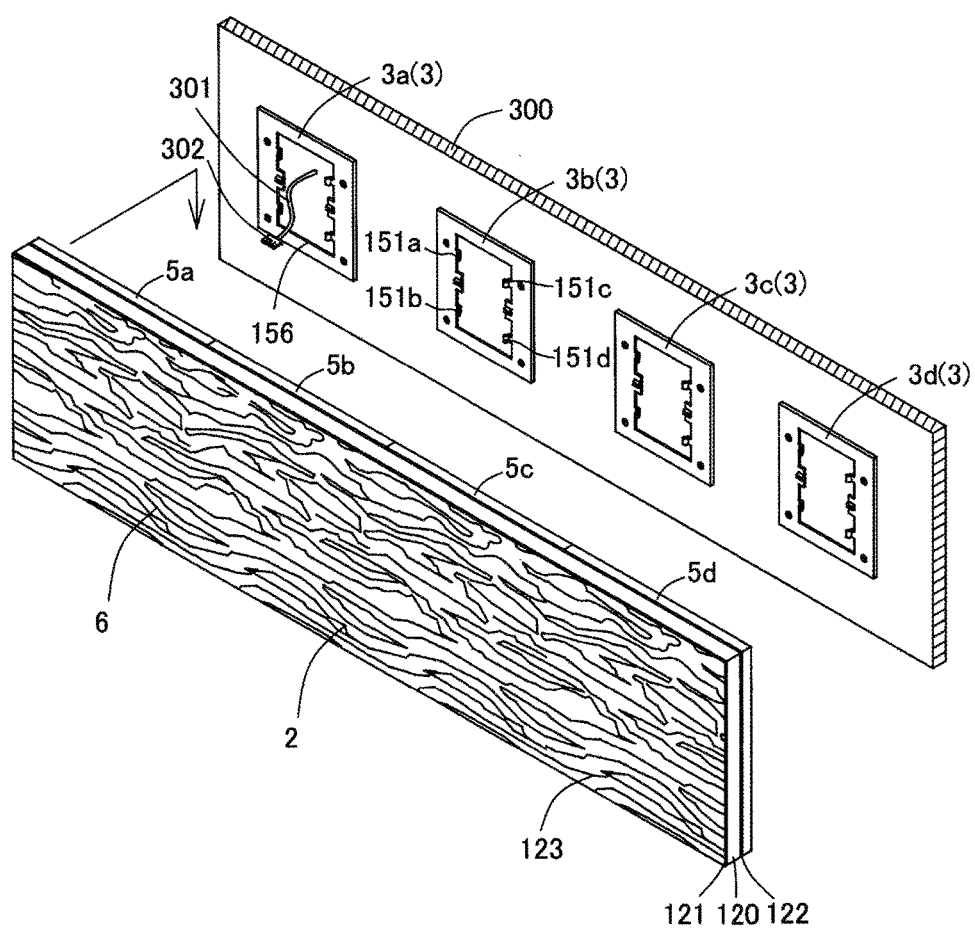
FIG. 14 is an explanatory view of a construction method of the interior building material according to the present invention, and is a perspective view showing a situation when the organic EL module is mounted to the mounting member.

Next, as shown in FIG. 14, each base part 73 of the organic EL module 2 is inserted into the through hole 156 of each of the mounting members 3a to 3d, and slid to the lower side in the vertical direction Y with the second raised part 82 fitted into the through hole 156, to engage the panel side engagement parts 95a to 95d with the attachment side engagement parts 151a to 151d.

Figure 15:
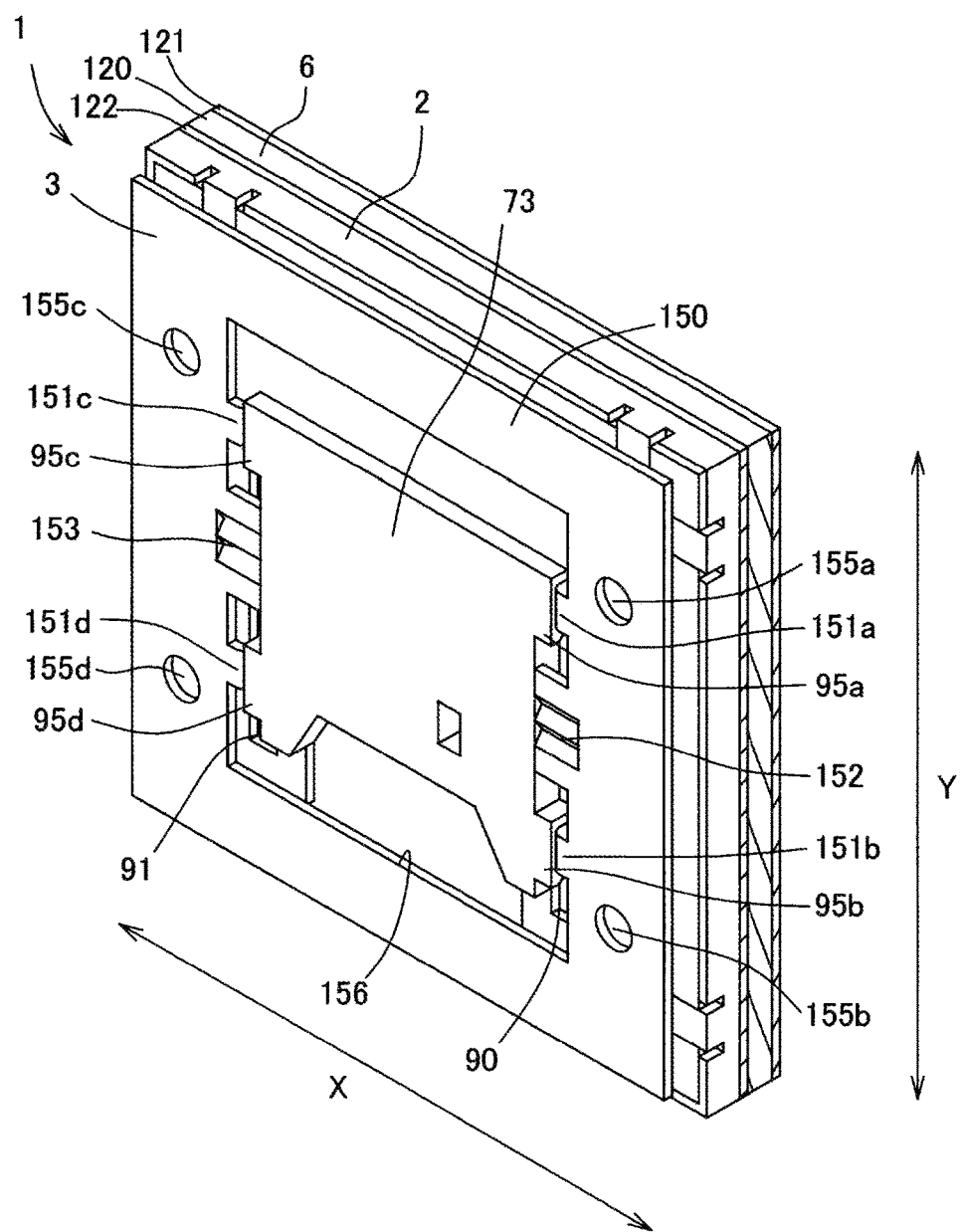
FIG. 15 is a cross-sectional perspective view of the interior building material of FIG. 2.
Figure 16:
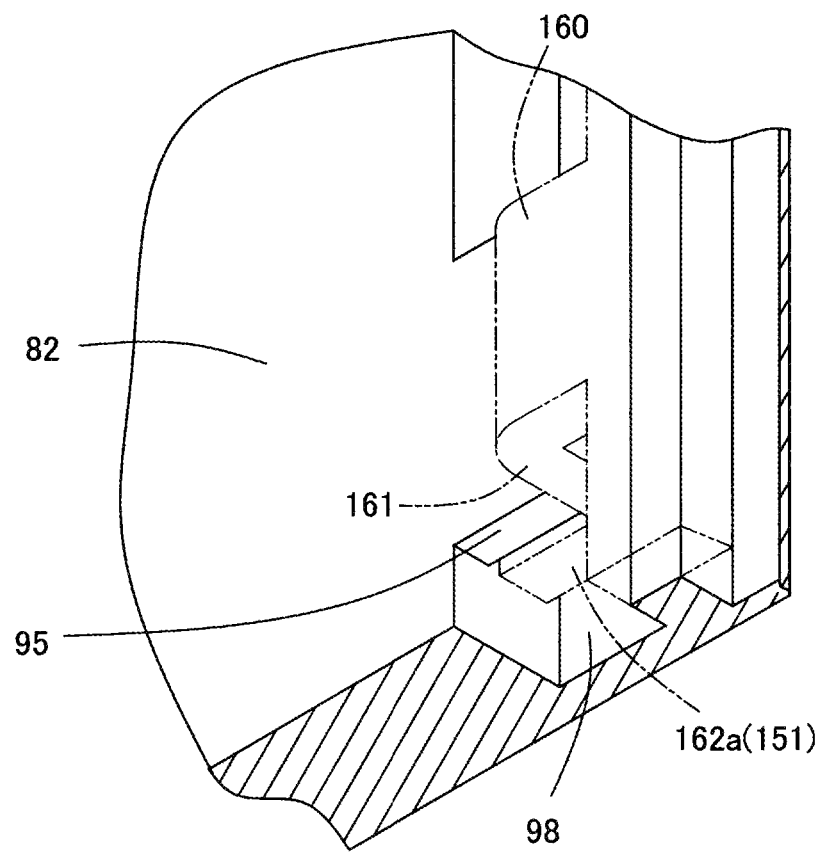
FIG. 16 is an enlarged perspective view of a principal part of FIG. 15.

At this time, as can be seen from FIGS. 15 and 16, the locking wall part 162 of the attachment side engagement part 151 is inserted into the insertion space 98 of the rear face side cover 70, and each of the organic EL panels 5 is regulated so as to move in an overlapping direction (thickness direction) and a sliding direction (vertical direction) with respect to the mounting member 3, by the locking wall part 162 of the attachment side engagement part 151. The case side locking pieces 92 and 93 of each of the organic EL panels 5 are engaged with the attachment side locking pieces 152 and 153 of the mounting member 3, and the movement in the sliding direction (vertical direction) is restricted.

Figure 17A:
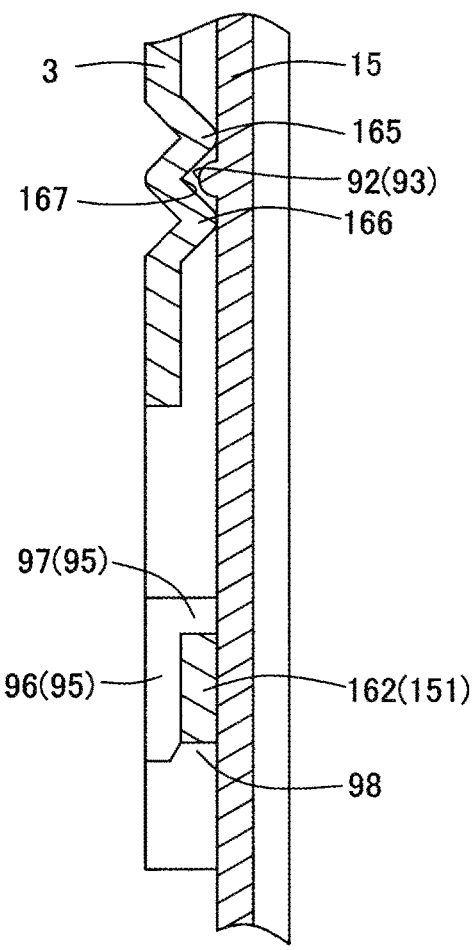

As shown in FIG. 17A, the case side locking piece 92(93) is fitted into the attachment side recess 167, and is sandwiched between the attachment side protrusions 165 and 166 forming a side wall of the attachment side recess 167. Therefore, a movement of the case side locking piece 92(93) in the sliding direction is restricted by the attachment side protrusions 165 and 166.

Figure 17B:
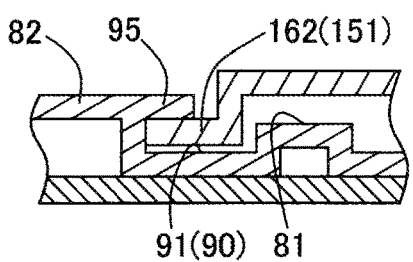

As shown in FIG. 17B, the locking wall part 162 of the attachment side engagement part 151 is located in the slide grooves 90 and 91, which is a position (bottom part side) lower than the first raised part 81. That is, the attachment side engagement part 151 is sandwiched between inner walls of the slide grooves 90 and 91, and a movement in the direction orthogonal to the sliding direction (lateral direction X) is restricted.

Between the mounting member 3 and each of the organic EL panels 5, a gap is formed. The main body 150 of the mounting member 3 is concealed by each of the organic EL panels 5 in a front view, and the fastening element 303 is inoperable.

For removing the organic EL module 2 from the mounting member 3, by sliding the organic EL module 2 upward in the vertical direction Y to release the engagement between the attachment side engagement parts 151a to 151d and the panel side engagement parts 95a to 95d, each of the base parts 73 of the organic EL module 2 is removed from the through hole 156 of the mounting members 3a to 3d.

Next, a change in the organic EL module 2 from a non-lighting state to a lighting state in the interior building material 1 according to the first embodiment of the present invention will be described.

Figure 18A:
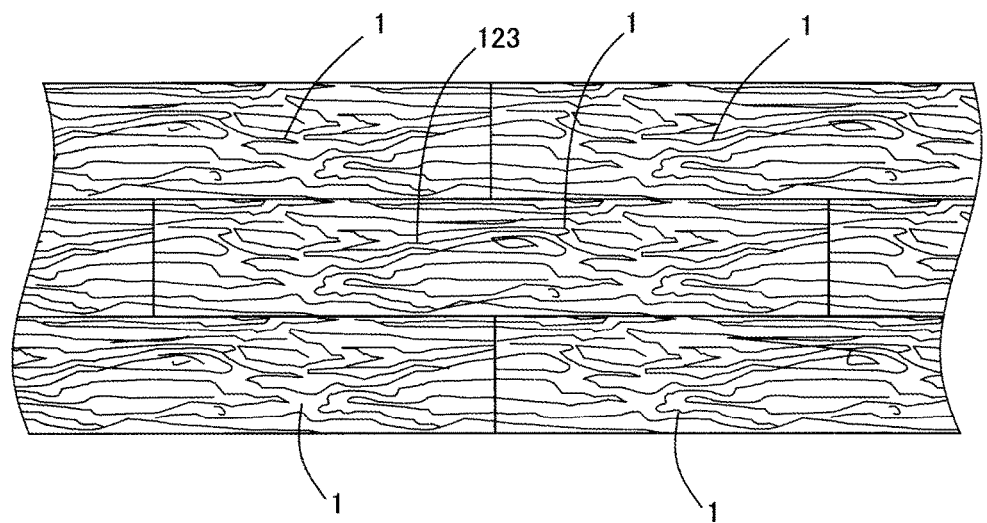

In the organic EL module 2 during non-lighting, the surface pattern of the organic EL module 2 is the first pattern 123 of the first pattern forming layer 121 exposed on the living space 305 side. That is, in the organic EL module 2 during non-lighting, although the second pattern forming layer 122 is provided, the second pattern 125 is not reflected on the surface, and the first pattern 123 is visible (FIG. 18A) since the light does not pass through from the side of each of the organic EL panel 5s.

Figure 18B:
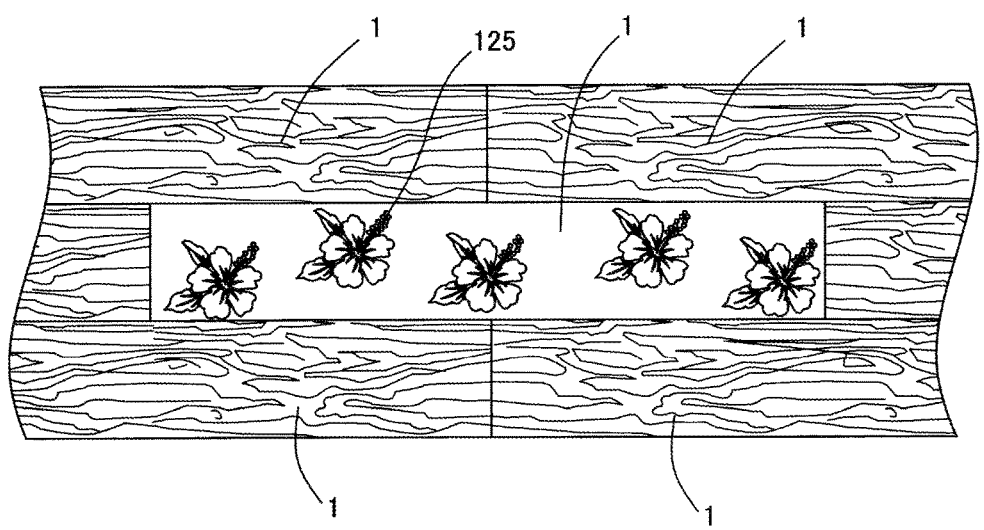

When the organic EL module 2 is lighted on, the emitted light from the emission surface 8 of each of the organic EL panels 5 exits outside while passing through the second pattern forming layer 122, the transparent substrate 120, and the first pattern forming layer 121, the second pattern 125 provided on the second pattern forming layer 122 is reflected on the surface, and the second pattern 125 becomes visible as a floating pattern (FIG. 18B).

At this time, the emitted light from the emission surface 8 of each of the organic EL panels 5 crosses inside the decorative member 6 and exits from an outside surface of the decorative member 6.

According to the interior building material 1 of the present embodiment, in an non-lighting state, the wall is seen as an ordinary woodgrain wall since the decorative member 6 expresses the first pattern 123 of woodgrain pattern, whereas in a lighting state, the wall is seen as a wall generating aesthetic appearance different from the ordinary woodgrain wall, since diffused light is emitted from each of the organic EL panels 5 to express the second pattern 125. Therefore, the appearance is different between during non-lighting and during lighting, making it possible to form a wall surface excellent in aesthetic appearance and decorative presentation.

According to the interior building material 1 of the present embodiment, the organic EL module 2 is attachable to and detachable from the mounting member 3, allowing easy replacement, maintenance, or the like of the organic EL module 2.

According to the interior building material 1 of the present embodiment, since each of the organic EL panels 5 that emits diffused light is used as the light source, the living space 305 side can be irradiated with soft light close to natural light during lighting. In addition, each of the organic EL panels 5 of a planar light source is used as the light source, suppressing color unevenness in the second pattern 125 during lighting.

Next, an interior building material 200 according to a second embodiment of the present invention will be described. Note that similar reference numerals are given to similar configurations to those of the first embodiment, and the description thereof will be omitted.

The interior building material 200 of the second embodiment is different from the interior building material 1 of the first embodiment in that a decorative member 6 and organic EL panels 5 can be divided.

Figure 19A:
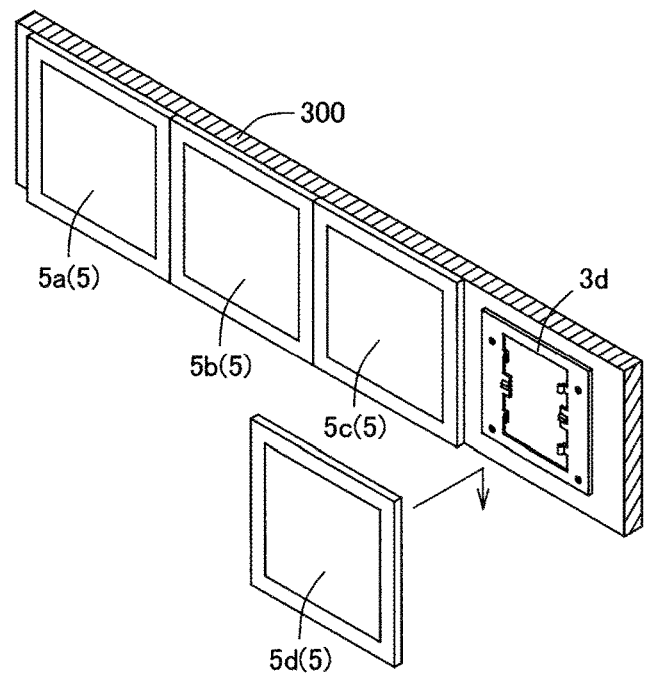
Figure 19B:
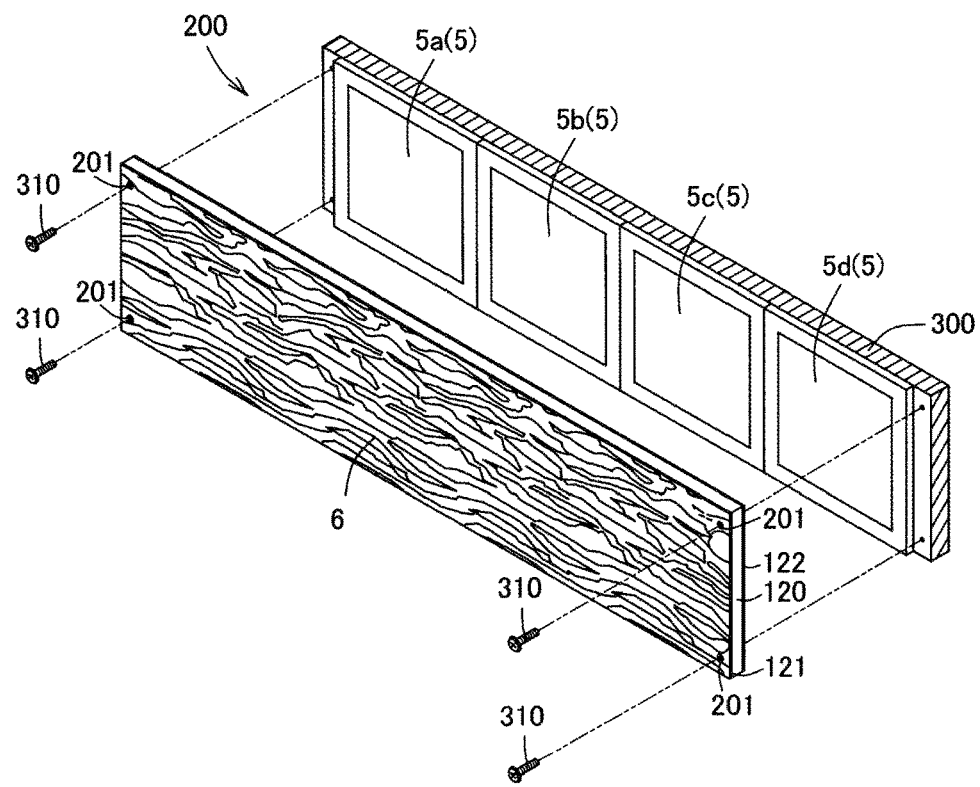

As shown in FIG. 19B, the decorative member 6 of the second embodiment is slightly larger in the lateral direction X than the decorative member 6 of the first embodiment, and includes a fixing hole 201 at each of both ends in the longitudinal direction (lateral direction X).

The fixing hole 201 is a through hole penetrating in a member thickness direction of the decorative member 6, and is an insertion hole that can be inserted with a temporary fastening element 310. The fixing hole 201 is provided near four corners of the decorative member 6, outside in an aligned-arrangement direction of each of the organic EL panels 5 in a front view.

Hereinafter, a construction method of the interior building material 200 of the second embodiment will be described.

First, as shown in FIG. 19A, a fastening element 303 is inserted through mounting holes 155a to 155d of mounting members 3a to 3d, the mounting members 3a to 3d each are mounted to the wall surface 300, and organic EL panels 5a to 5d are respectively mounted to the mounting members 3a to 3d.

At this time, the organic EL panels 5 are arranged aligned in a row in a lateral direction. Adjacent organic EL panels 5 and 5 are in a state where end face side covers 51 and 51 are opposed to and close to each other, which are end faces in the aligned-arrangement direction. A distance between the end faces of the adjacent organic EL panels 5 and 5 in the aligned-arrangement direction is preferably 0 mm or more to 10 mm or less. In the present embodiment, the end faces of the adjacent organic EL panels 5 and 5 in the aligned-arrangement direction are in close contact with each other. That is, the organic EL panels 5 are arranged without gaps.

Next, as shown in FIG. 19B, the temporary fastening element 310 is inserted into the fixing hole 201 of the decorative member 6, the decorative member 6 is fixed to the wall surface 300 with the temporary fastening element 310, and a mounting structure of the interior building material 200 is formed.

At this time, a second pattern forming layer 122 of the decorative member 6 and an emission surface 8 of each of the organic EL panels 5a to 5d are facing each other. A surface of the decorative member 6 on a side of each of the organic EL panels 5 is preferably in close contact with the emission surface 8 of the organic EL panel 5.

For removing an organic EL module 2 from the mounting member 3, firstly, the temporary fastening element 310 is removed from the wall surface 300, and the decorative member 6 is detached. Then, by slidingly moving the organic EL module 2 upward in the vertical direction Y to release the engagement between the attachment side engagement parts 151a to 151d and panel side engagement parts 95a to 95d, each base part 73 of the organic EL module 2 is removed from a through hole 156 of the mounting members 3a to 3d.

Next, an interior building material 250 according to a third embodiment of the present invention will be described. Note that similar reference numerals are given to similar configurations to those of the first and second embodiments, and the description thereof will be omitted.

Figure 20:
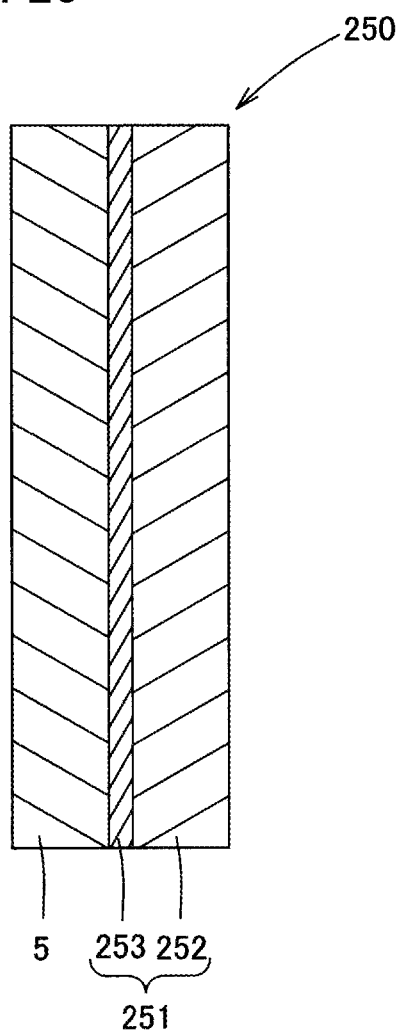
FIG. 20 is a cross-sectional view of an organic EL module of an interior building material according to a third embodiment of the present invention.

In the interior building material 250 of the third embodiment, a structure of a decorative member is different from that of the interior building material 1 of the first embodiment, and as shown in FIG. 20, a pattern forming layer 253 is formed on one main surface of a transparent substrate 252.

The pattern forming layer 253 includes a first pattern 255 drawn with a first thermochromic ink on a transparent resin film, and a second pattern 256 drawn with a second thermochromic ink.

The first thermochromic ink is an ink reversibly showing a colored-colorless change based on a predetermined temperature (first color-changing temperature). The first thermochromic ink is colored below the first color-changing temperature, and is colorless at the first color-changing temperature or higher.

The first color-changing temperature is a temperature raised by an emission surface 8 during lighting of organic EL panels 5, and is preferably 40 degrees Celsius or more to 60 degrees Celsius or less.

Within this range, color-changing due to ambient temperature or the like is unlikely to occur, and sensitivity is also favorable.

The second thermochromic ink is an ink reversibly showing a colorless-colored change based on a predetermined temperature (second color-changing temperature). The second thermochromic ink is colorless below the second color-changing temperature and is colored at the second color-changing temperature or higher.

The second color-changing temperature is a temperature raised by the emission surface 8 during lighting of the organic EL panels 5, and is preferably 40 degrees Celsius or more to 60 degrees Celsius or less.

Within this range, color-changing due to ambient temperature or the like is unlikely to occur, and sensitivity is also favorable.

Note that the first color-changing temperature and the second color-changing temperature may be the same temperature or different temperatures. A temperature difference between the first color-changing temperature and the second color-changing temperature is preferably 5 degrees Celsius or less. Within this range, it is possible to smoothly change from the first pattern 255 to the second pattern 256 in accordance with the temperature change during lighting.

In the interior building material 250, the pattern forming layer 253 of a decorative member 251 is located on the emission surface 8 side of each of the organic EL panels 5, while the transparent substrate 252 is located on a living space 305 side.

Next, a change in the organic EL module from a non-lighting state to a lighting state in the interior building material 250 according to the third embodiment of the present invention will be described.

Figure 21A:
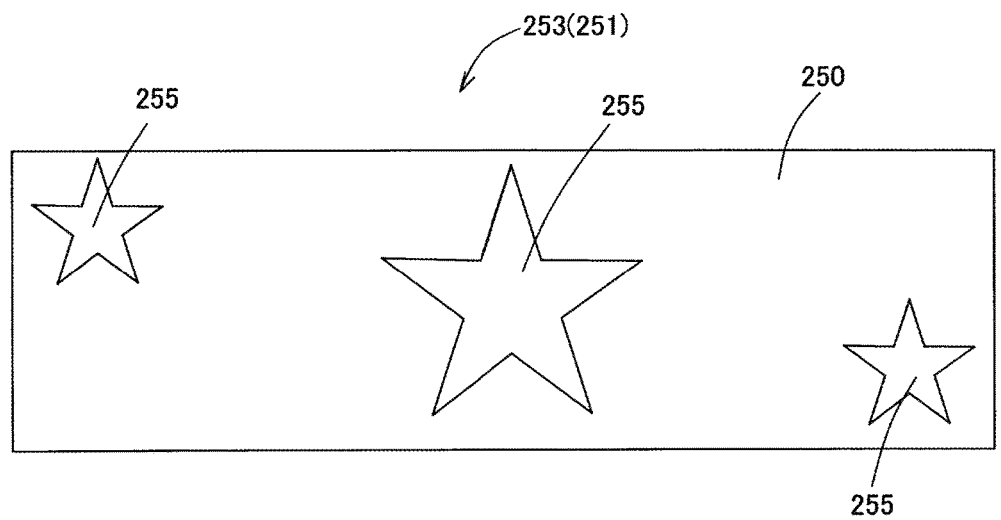

In the organic EL module during non-lighting, as shown in FIG. 21A, since the temperature of the decorative member 251 is low and less than each color-changing temperature, the first pattern 255 appears and the second pattern 256 disappears. Therefore, only the first pattern 255 is visible.

Figure 21B:
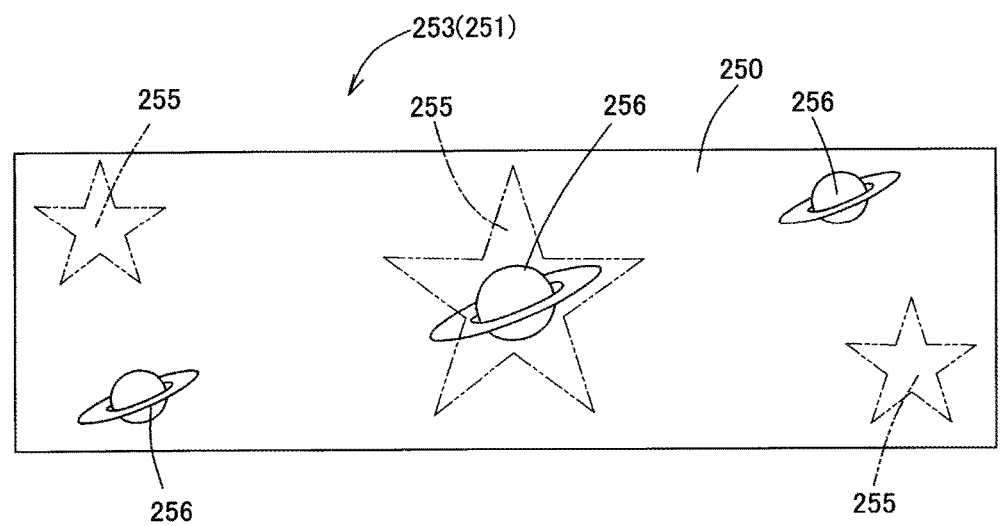

When the organic EL module 2 is lighted on, so that the emitted light from the emission surface 8 of each of the organic EL panels 5 exits outside while passing through the pattern forming layer 253 and the transparent substrate 252, and the temperature of the decorative member 251 reaches each color-changing temperature or higher by heat generation of the emission surface 8, the first pattern 255 disappears and the second pattern 256 appears as shown in FIG. 21B. Therefore, only the second pattern 256 is visible.

According to the interior building material 250 of the third embodiment, one pattern appears and the other pattern disappears with temperature change of the decorative member 251 by lighting on and lighting off, enabling display of a clear pattern on the surface of the interior building material 250.

Next, an interior building material 270 according to a fourth embodiment of the present invention will be described. Note that similar reference numerals are given to similar configurations to those of the first to third embodiments, and the description thereof will be omitted.

Figure 22:
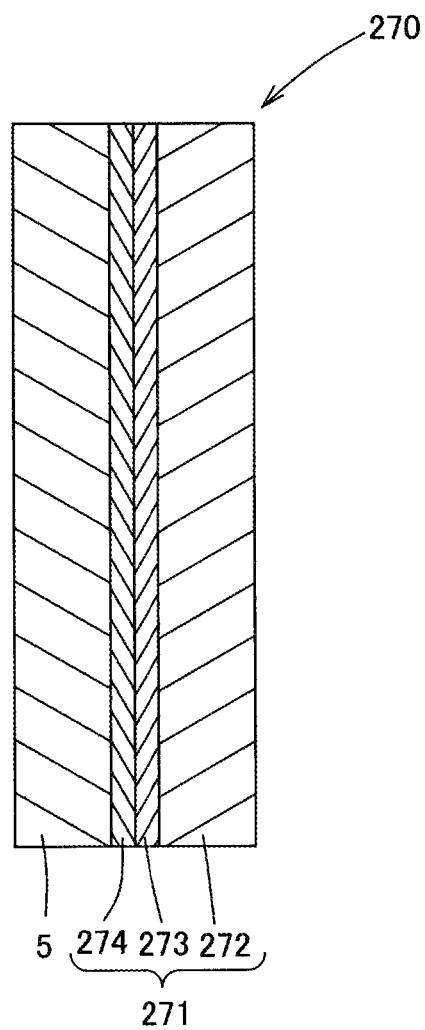
FIG. 22 is a cross-sectional view of an organic EL module of an interior building material according to a fourth embodiment of the present invention.

In the interior building material 270 of the fourth embodiment, a structure of a decorative member is different from that of the interior building material 250 of the third embodiment. In a decorative member 271 of the fourth embodiment, as shown in FIG. 22, a first pattern forming layer 273, and a second pattern forming layer 274 are laminated in this order on one main surface of a transparent substrate 272.

The first pattern forming layer 273 includes a first pattern 255 drawn on a transparent resin film with a first thermochromic ink.

The second pattern forming layer 274 includes a second pattern 256 drawn on a transparent resin film with a non-color-changing ink.

The non-color-changing ink is an ink that basically does not change color in an operating temperature range of an organic EL module 2, and is a general-purpose ink.

In the interior building material 270, the second pattern forming layer 274 is located on an emission surface 8 side of organic EL panels 5 in the decorative member 271, and the first pattern forming layer 273 is located on a living space 305 side.

Next, a change in the organic EL module from a non-lighting state to a lighting state in the interior building material 270 according to the fourth embodiment of the present invention will be described.

In the organic EL module during non-lighting, the first pattern 255 appears since a temperature of the decorative member 271 is low and less than a first color-changing temperature. Although the second pattern forming layer 274 is provided, the second pattern 256 is not reflected on the surface, and only the first pattern 255 is visible with light from the living space 305 side since the light does not pass through from the side of each of the organic EL panels 5.

When the organic EL module 2 is lighted on, the emitted light from the emission surface 8 of each of the organic EL panels 5 exits outside while passing through the second pattern forming layer 274, the first pattern forming layer 273, and the transparent substrate 272 to project the second pattern 256 on the surface, and the temperature of the decorative member 271 reaches the color-changing temperature or higher with heat generation of the emission surface 8 of each of the organic EL panels 5, then the first pattern 255 disappears. Therefore, only the second pattern 256 is visible.

Figure 23:
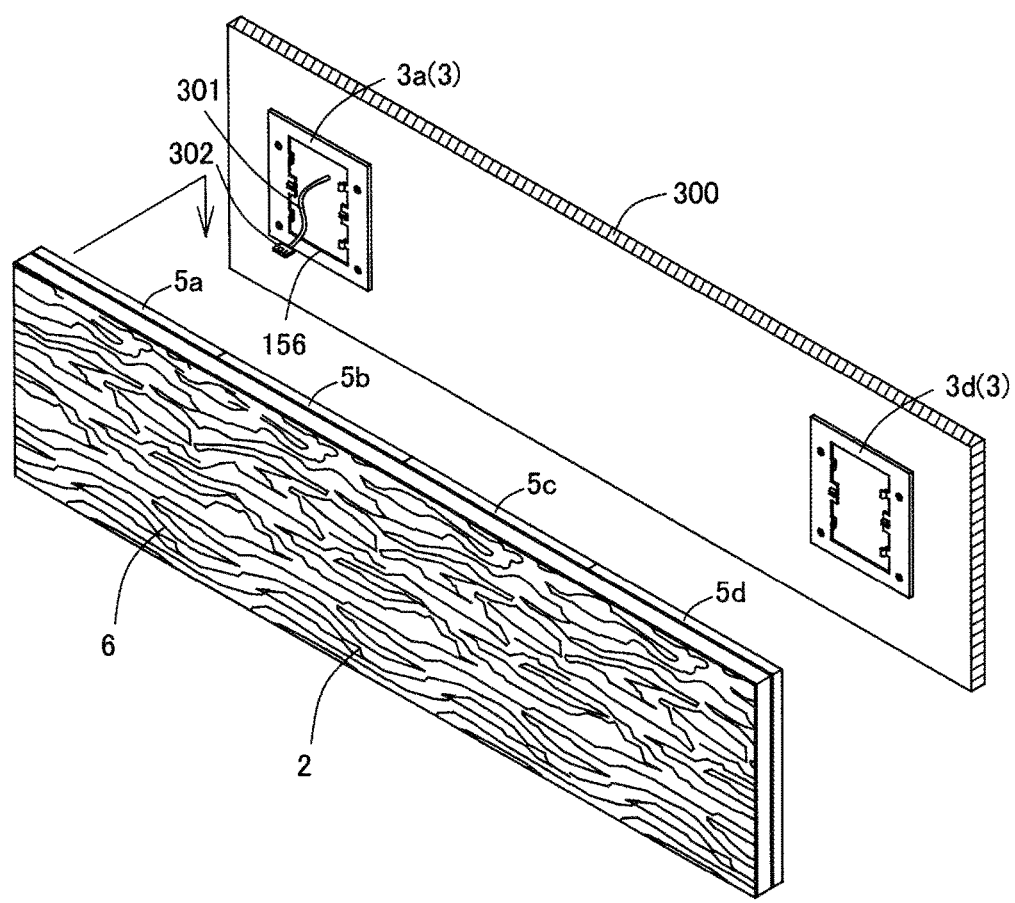
FIG. 23 is an explanatory view of a construction method of an interior building material according to another embodiment of the present invention.
Figure 24:
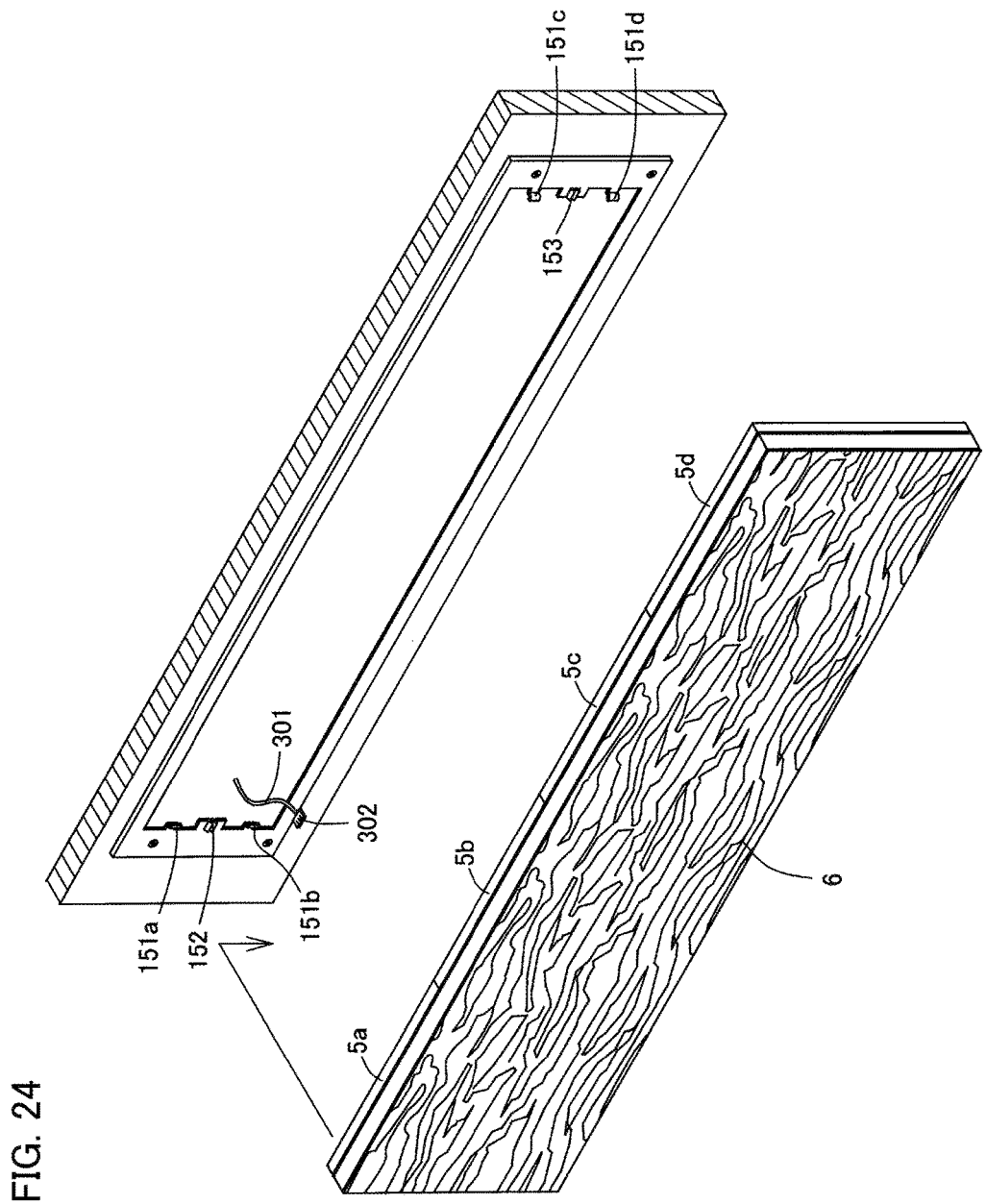
FIG. 24 is an explanatory view of a construction method of an interior building material according to another embodiment of the present invention.

In the above-described first embodiment, the mounting member 3 is mounted to the wall surface 300 so as to correspond to each of the organic EL panels 5, but the present invention is not limited to this. For example, as shown in FIG. 23, only a mounting member 3 to fix organic EL panels 5 at both ends in the aligned-arrangement direction may be fixed to the wall surface 300, and the organic EL module 2 may be mounted. In addition, as shown in FIG. 24, an organic EL module 2 may be mounted by one mounting member having engagement parts 151a to 151d and locking pieces 152 and 153.

In the above-described first embodiment, the decorative member 6 has the structure in which the second pattern forming layer 122, the transparent substrate 120, and the first pattern forming layer 121 are directly laminated in this order from the emission surface 8 side of each of the organic EL panels 5, but the present invention is not limited to this. Another layer may be appropriately provided each between the emission surface 8 of each of the organic EL panels 5 and the second pattern forming layer 122, between the second pattern forming layer 122 and the transparent substrate 120, between the transparent substrate 120 and the first pattern forming layer 121, and outside the first pattern forming layer 121.

Similarly, in the above-described third embodiment, the decorative member 251 has the structure in which the pattern forming layer 253 and the transparent substrate 252 are directly laminated in this order from the emission surface 8 side of each of the organic EL panels 5, but the present invention is not limited to this. Another layer may be appropriately provided each between the emission surface 8 of each of the organic EL panels 5 and the pattern forming layer 253, between the pattern forming layer 253 and the transparent substrate 252, and outside the transparent substrate 252.

Similarly, the decorative member 271 of the above-described fourth embodiment has the structure in which the second pattern forming layer 274, the first pattern forming layer 273, and the transparent substrate 272 are directly laminated, but the present invention is not limited to this. Another layer may be appropriately provided each between the emission surface 8 of each of the organic EL panels 5 and the second pattern forming layer 274, between the second pattern forming layer 274 and the first pattern forming layer 273, between the first pattern forming layer 273 and the transparent substrate 272, and outside the transparent substrate 272.

In the above-described embodiment, the organic EL panels 5a to 5d each are electrically connected in series by the connecting cable members 7a to 7c, but the present invention is not limited to this. The organic EL panels 5a to 5d each may be electrically connected in parallel by the connecting cable members 7a to 7c. This enables lighting of other organic EL panels 5 even when one organic EL panel 5 is removed, at a time of replacing the organic EL panel 5 or the like.

Figure 25A:
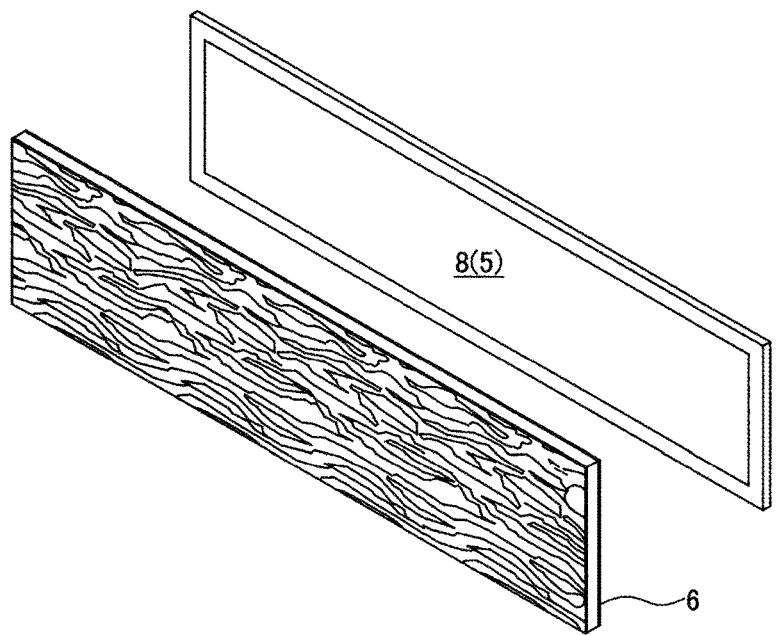

In the above-described embodiment, one decorative member 6 straddles four organic EL panels 5 in a front view, but the present invention is not limited to this. The emission surface 8 may be covered with one decorative member 6 per one organic EL panel 5, or as shown in FIG. 25A, while using an organic EL panel 5 having an emission surface 8 matching the shape of the decorative member 6, the emission surface 8 of this organic EL panel 5 may be covered with the decorative member 6. Further, one decorative member 6 may straddle two or three organic EL panels 5, or may straddle five or more organic EL panels 5.

Figure 25B:
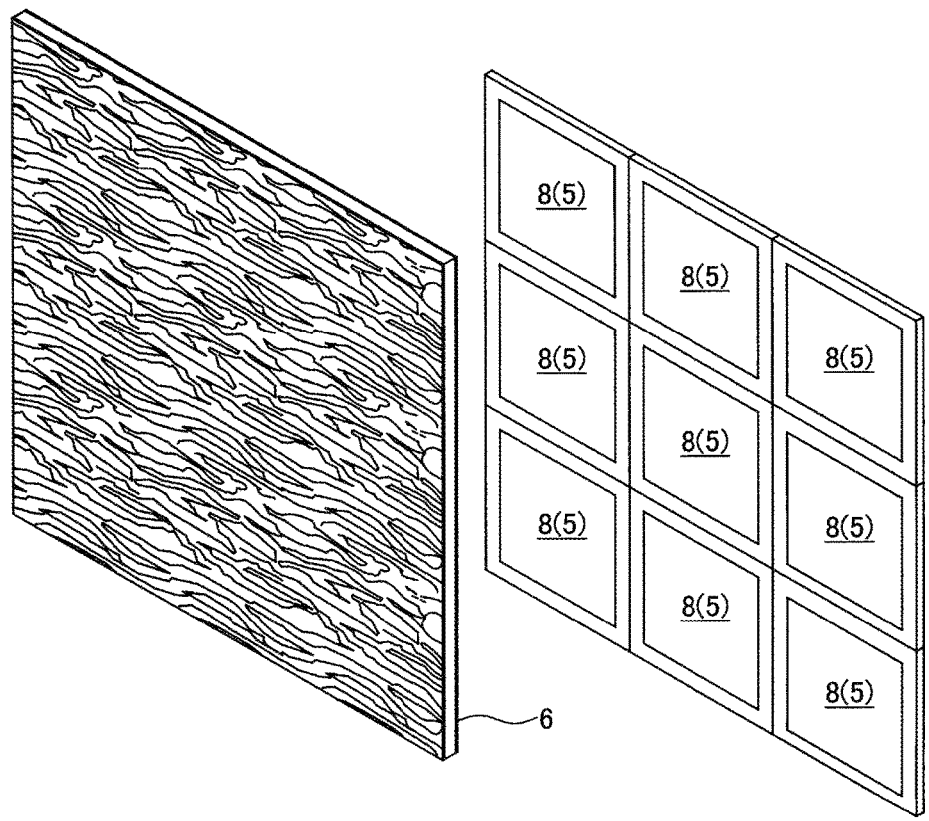

In the above embodiment, a plurality of the organic EL panels 5 are arranged aligned in a row on one decorative member 6, but the present invention is not limited to this. A plurality of organic EL panels 5 may be arranged aligned to be planarly extended on one decorative member 6. For example, as shown in FIG. 25B, a plurality of organic EL panels 5 may be attached to a decorative member 6, to be distributed in a vertical and horizontal grid pattern for planarly filling. Further, the organic EL panels 5 may be attached to be distributed zigzag for planarly filling.

In the above-described embodiment, engagement and disengagement of the attachment side engagement parts 151a to 151d of the mounting member 3 with the panel side engagement parts 95a to 95d of each of the organic EL panels 5 enable attachment and detachment of each of the organic EL panels 5 to and from the mounting member 3, but the present invention is not limited to this. The mounting member 3 and each of the organic EL panels 5 may be attachable to and detachable from each other by another attaching and detaching means such as a magnet.

In the above-described first embodiment, the first pattern 123 of the first pattern forming layer 121 is woodgrain while the second pattern 125 of the second pattern forming layer 122 is a floral pattern, but the present invention is limited to this. As long as the patterns of the first pattern 123 and the second pattern 125 are different, the pattern and color are not limited. For example, the first pattern 123 may be a marble pattern or color.

In the above-described embodiment, a case has been described where the organic EL panels 5 are adopted as the planar light-emitting panel, but the present invention is not limited to this. The planar light-emitting panel may be another planar light source that emits light planarly. For example, an LED panel with LEDs planarly laid may be used.

In the above-described first embodiment, a case has been described where the interior building material 1 is mounted to the smooth wall surface 300, but the present invention is not limited to this. The wall surface 300 may be provided with an opening that communicates with a flow path through which air is circulated, so that air flows to the rear face side of the organic EL module 2, on the wall surface 300. This causes a rear face of the organic EL module 2 to be exposed to air and heat-exchanged, enabling suppression of heat generation of the organic EL module 2.

In the above-described embodiment, the mounting member 3 and each of the organic EL panels 5 are directly engaged with each other, and each of the organic EL panels 5 can be directly attachable to and detachable from the mounting member 3, but the present invention is limited to this. Each of the organic EL panels 5 may be indirectly attachable to and detachable from the mounting member 3 via another member.

In the interior building material 200 of the above-described second embodiment, the decorative member 6 and the organic EL panels 5 can be divided, but the present invention is not limited to this. As with the interior building material 1 of the first embodiment, the decorative member 6 and the organic EL panels 5 may be inseparably integrated.

In the above-described embodiments, each component member can be freely exchanged or added between the individual embodiments within the technical scope of the present invention.

EXPLANATION OF REFERENCE CHARACTERS 1, 200, 250, 270: interior building material
3, 3a to 3d: mounting member
5, 5a to 5d: organic EL panel (planar light-emitting panel)
95a to 95d: panel side engagement part
123, 255: first pattern
125, 256: second pattern
121, 273: first pattern forming layer
122, 274: second pattern forming layer
151a to 151d: attachment side engagement part
252, 272: transparent substrate (transparent resin)
300: wall surface
310: temporary fastening element

The invention claimed is:
1. An interior building material comprising:
a mounting member fixed to a wall surface of a fixed structure;
a decorative member; and
a plurality of planar light-emitting panels interposed between the mounting member and the decorative member,
wherein one of the plurality of planar light-emitting panels is directly or indirectly attachable to and detachable from the mounting member with capability of supplying power from the mounting member side,
wherein the decorative member covers across emission surfaces of the plurality of planar light-emitting panels, the decorative member presenting a first pattern during non-lighting,
wherein during lighting, the decorative member transmits emitted light from the emission surface through the decorative member,
wherein each of the planar light-emitting panels comprises: a panel body; and a fixing member,
the fixing member comprising:
a main body; and
a raised part disposed to a rear face side of the planar light-emitting panel and raised from the main body to the rear face side, the raised part including a plurality of panel side engagement parts that protrude in a direction orthogonal to a raising direction of the raised part,
wherein two of the panel side engagement parts project in a direction separating from each other,
wherein the mounting member comprises:
a mounting side main body; and
a plurality of mounting side engagement parts,
two of the mounting side engagement parts projecting in a direction bringing close to each other, and
wherein mounting the planar light-emitting panel to the mounting member includes a process of sliding the planar light-emitting panel to a vertical direction to engage the two of the mounting side engagement parts with the two of the panel side engagement parts.

2. The interior building material according to claim 1, wherein during lighting, the decorative member transmits a part of emitted light from the emission surface through the decorative member to express a second pattern different from the first pattern.

3. The interior building material according to claim 1, wherein the planar light-emitting panel is an organic EL panel,
wherein the decorative member includes a first surface facing to the emission surfaces of the planar light-emitting modules, and
wherein a distance between the first surface and the emission surface is 0 mm or more to 10 mm or less.

4. The interior building material according to claim 1, wherein the planar light-emitting panels are electrically connected with each other.

5. The interior building material according to claim 1, wherein the decorative member is a plate material including a first pattern forming layer that forms the first pattern and a second pattern forming layer that forms a second pattern different from the first pattern,
wherein the first pattern forming layer faces to the second pattern forming layer in a thickness direction of the decorative member with a transparent resin in between, and
wherein the second pattern forming layer is located nearer to the planar light-emitting panel than the first pattern forming layer.

6. The interior building material according to claim 1, wherein the mounting member comprises an attachment side engagement part while the planar light-emitting panel comprises a panel side engagement part engageable with the attachment side engagement part, and
wherein mounting the planar light-emitting panel to the mounting member includes a process of sliding the planar light-emitting panel to a vertical direction to engage the mounting side engagement part with the panel side engagement part.

7. The interior building material according to claim 6, wherein the planar light-emitting panels are arranged side by side in a row in a lateral direction, and
wherein a distance between end faces of the adjacent planar light-emitting panels is 0 mm or more, and 10 mm or less, the end faces opposing to each other in an arranging direction.

8. The interior building material according to claim 1, wherein the plurality of planar light-emitting panels are attached to the decorative member,
wherein the plurality of planner light-emitting panels includes a first and a second planar light-emitting panels, and
wherein attachment of the second planar light-emitting panel to the mounting member enables the first planar light-emitting panel to be indirectly attached to the mounting member while detachment of the second planar light-emitting panel from the mounting member enables the first planar light-emitting panel to be indirectly detached from the mounting member.

9. The interior building material according to claim 1, wherein the decorative member comprises an insertion hole that can be inserted with a temporary fastening element, and
wherein insertion of the temporary fastening element into the insertion hole enables the decorative member to fix the planar light-emitting panel with the planar light-emitting panel inserted between the mounting member and the decorative member.

10. An interior building material comprising:
a mounting member fixed to a wall surface of a fixed structure;
a decorative member; and
a planar light-emitting panel interposed between the mounting member and the decorative member,
wherein the planar light-emitting panel is directly or indirectly attachable to and detachable from the mounting member with capability of supplying power from the mounting member side,
wherein the decorative member covers an emission surface of the planar light-emitting panel, the decorative member presenting a first pattern during non-lighting, and
wherein during lighting, the decorative member transmits a part of emitted light from the emission surface through the decorative member to express a second pattern different from the first pattern, the first pattern disappearing with heat generation accompanying lighting of the planar light-emitting panel.

* * * * *